US012770687B2

(12) United States Patent
Li

(10) Patent No.: US 12,770,687 B2
(45) Date of Patent: Oct. 20, 2026

(54) SEMICONDUCTOR MEMORY DEVICE

(71) Applicant: Kioxia Corporation, Tokyo (JP)

(72) Inventor: Xu Li, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 19 days.

(21) Appl. No.: 18/964,133

(22) Filed: Nov. 29, 2024

(65) Prior Publication Data

US 2025/0095741 A1 Mar. 20, 2025

Related U.S. Application Data

(63) Continuation of application No. 17/541,103, filed on Dec. 2, 2021, now Pat. No. 12,190,953, which is a continuation of application No. 17/010,564, filed on Sep. 2, 2020, now Pat. No. 11,238,935.

(30) Foreign Application Priority Data

Mar. 18, 2020 (JP) ................................ 2020-047946

(51) Int. Cl.

| | |
|---|---|
| ***G11C 16/24*** | (2006.01) |
| ***G11C 16/04*** | (2006.01) |
| ***G11C 16/08*** | (2006.01) |
| ***G11C 16/10*** | (2006.01) |
| ***G11C 16/16*** | (2006.01) |
| ***G11C 16/30*** | (2006.01) |
| ***G11C 16/32*** | (2006.01) |

(Continued)

(52) U.S. Cl.

CPC .......... *G11C 16/08* (2013.01); *G11C 16/0483* (2013.01); *G11C 16/10* (2013.01); *G11C 16/16* (2013.01); *G11C 16/30* (2013.01); *G11C 16/32* (2013.01); *G11C 16/3427* (2013.01); *G11C 16/24* (2013.01); *H10B 69/00* (2023.02)

(58) Field of Classification Search

CPC ..................................................... G11C 16/24

See application file for complete search history.

(56) References Cited

U.S. PATENT DOCUMENTS

| | | | |
|---|---|---|---|
| 7,859,902 | B2 | 12/2010 | Maejima |
| 7,936,004 | B2 | 5/2011 | Kito et al. |

(Continued)

FOREIGN PATENT DOCUMENTS

| | | | |
|---|---|---|---|
| JP | 2007-266143 | A | 10/2007 |
| JP | 2009-266946 | A | 11/2009 |
| JP | 2010-080729 | A | 4/2010 |

*Primary Examiner* — Jason Lappas

(74) *Attorney, Agent, or Firm* — Kim & Stewart LLP

(57) ABSTRACT

A semiconductor memory device includes a memory cell array, a well voltage control circuit, and a source voltage control circuit. Before writing data, first and second transistors respectively connected to a select gate line and a word line are turned on at a first timing, and a ground voltage is applied to the first transistor at a second timing and to the second transistor at a third timing. The source voltage control circuit applies a first voltage to the source line at a fourth timing that is simultaneous with or after the first timing and before the second timing, and the well voltage control circuit applies the first voltage to the well region at a fifth timing that is simultaneous with or after the first timing and before the second timing, and applies a ground voltage to the well region at a sixth timing that is after the fifth timing.

17 Claims, 15 Drawing Sheets

(51) Int. Cl.

| | |
|---|---|
| ***G11C 16/34*** | (2006.01) |
| *H10B 69/00* | (2023.01) |

(56) References Cited

U.S. PATENT DOCUMENTS

| | | | | |
|---|---|---|---|---|
| 8,334,551 | B2 | 12/2012 | Itagaki et al. | |
| 2011/0292732 | A1* | 12/2011 | Ha | G11C 16/24<br>365/185.25 |

* cited by examiner

FIG. 5A

| | SU0 | SU1 | SU2 | SU3 |
|---|---|---|---|---|
| WL7 | | | | |
| WL6 | | | | |
| WL5 | | | | |
| WL4 | | | | |
| WL3 | | | | |
| WL2 | | ... | | |
| WL1 | 5 | 6 | 7 | 8 |
| WL0 | 1 | 2 | 3 | 4 |

FIG. 5B

| | SU0 | SU1 | SU2 | SU3 |
|---|---|---|---|---|
| WL7 | 1 | 2 | 3 | 4 |
| WL6 | 5 | 6 | 7 | 8 |
| WL5 | | ... | | |
| WL4 | | | | |
| WL3 | | | | |
| WL2 | | | | |
| WL1 | | | | |
| WL0 | | | | |

| Page | DATA | | | | | | | |
|---|---|---|---|---|---|---|---|---|
| Upper | 1 | 1 | 0 | 0 | 0 | 1 | 1 | 0 |
| Middle | 1 | 0 | 0 | 1 | 1 | 1 | 0 | 0 |
| Lower | 1 | 1 | 1 | 1 | 0 | 0 | 0 | 0 |

FIG. 16

| VERIFY TARGET STATE / NUMBER OF LOOPS | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "A" STATE (VfyA) | ○ | ○ | ○ | ○ | ○ | ○ | | | | | | | | | | | | | |
| "B" STATE (VfyB) | | | ○ | ○ | ○ | ○ | ○ | ○ | | | | | | | | | | | |
| "C" STATE (VfyC) | | | | | ○ | ○ | ○ | ○ | ○ | ○ | | | | | | | | | |
| "D" STATE (VfyD) | | | | | | | ○ | ○ | ○ | ○ | ○ | ○ | | | | | | | |
| "E" STATE (VfyE) | | | | | | | | | ○ | ○ | ○ | ○ | ○ | ○ | | | | | |
| "F" STATE (VfyF) | | | | | | | | | | | ○ | ○ | ○ | ○ | ○ | ○ | | | |
| "G" STATE (VfyG) | | | | | | | | | | | | | | ○ | ○ | ○ | ○ | ○ | ○ |

FIG. 17

| WRITE TARGET STATE / NUMBER OF LOOPS | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "Er" STATE (inhibit) | 1 | 1 | 1 | 1 | 1 | 1 | 1 | 1 | 1 | 1 | 1 | 1 | 1 | 1 | 1 | 1 | 1 | 1 | 1 |
| "A" STATE | 0 | 0/1 | 0/1 | 0/1 | 0/1 | 0/1 | 1 | 1 | 1 | 1 | 1 | 1 | 1 | 1 | 1 | 1 | 1 | 1 | 1 |
| "B" STATE | 0 | 0 | 0 | 0/1 | 0/1 | 0/1 | 0/1 | 0/1 | 1 | 1 | 1 | 1 | 1 | 1 | 1 | 1 | 1 | 1 | 1 |
| "C" STATE | 0 | 0 | 0 | 0 | 0 | 0/1 | 0/1 | 0/1 | 0/1 | 0/1 | 1 | 1 | 1 | 1 | 1 | 1 | 1 | 1 | 1 |
| "D" STATE | 0 | 0 | 0 | 0 | 0 | 0 | 0 | 0/1 | 0/1 | 0/1 | 0/1 | 0/1 | 1 | 1 | 1 | 1 | 1 | 1 | 1 |
| "E" STATE | 0 | 0 | 0 | 0 | 0 | 0 | 0 | 0 | 0 | 0/1 | 0/1 | 0/1 | 0/1 | 0/1 | 1 | 1 | 1 | 1 | 1 |
| "F" STATE | 0 | 0 | 0 | 0 | 0 | 0 | 0 | 0 | 0 | 0 | 0 | 0/1 | 0/1 | 0/1 | 0/1 | 0/1 | 1 | 1 | 1 |
| "G" STATE | 0 | 0 | 0 | 0 | 0 | 0 | 0 | 0 | 0 | 0 | 0 | 0 | 0 | 0 | 0/1 | 0/1 | 0/1 | 0/1 | 0/1 |

SEMICONDUCTOR MEMORY DEVICE

CROSS-REFERENCE TO RELATED APPLICATION(S)

This application is a continuation of U.S. patent application Ser. No. 17/541,103, filed Dec. 2, 2021, which is a continuation of U.S. patent application Ser. No. 17/010,564, filed Sep. 2, 2020, now U.S. Pat. No. 11,238,935, issued Feb. 1, 2022, which is based upon and claims the benefit of priority from Japanese Patent Application No. 2020-047946, filed Mar. 18, 2020, the entire contents of which are incorporated herein by reference.

FIELD

Embodiments described herein relate generally to a semiconductor memory device.

BACKGROUND

A NAND flash memory is known as one type of semiconductor memory device.

BRIEF DESCRIPTION OF THE DRAWINGS

FIGS. 5A and 5B are diagrams showing a data write order.

FIG. 16 is a diagram showing a relationship between the number of loops and program operation and verify operation in a sequence of write operation.

FIG. 17 is a diagram showing a relationship between the number of loops and a bit line voltage in the sequence of the write operation.

DETAILED DESCRIPTION

Embodiments provide a semiconductor memory device capable of improving operation performance and reliability of a memory cell.

In general, according to one embodiment, a semiconductor memory device includes a semiconductor substrate having a substrate surface extending in a first direction and a second direction intersecting the first direction; a well region formed on a surface layer of the semiconductor substrate; and a source line formed on the well region of the surface layer of the semiconductor substrate; a first select gate line stacked above the well region in a third direction orthogonal to the first direction and the second direction; a plurality of word lines stacked above the first select gate line in the third direction; a second select gate line stacked above the plurality of word lines in the third direction; a plurality of bit lines disposed above the second select gate line in the third direction and extending in the first direction; a memory cell array including a plurality of memory strings extending in the third direction and connected between corresponding bit lines and the source line; a well voltage control circuit configured to control a voltage to be applied to the well region; a source voltage control circuit configured to control a voltage to be applied to the source line; and a row decoder that is controlled to apply a voltage to the first select gate line, the plurality of word lines, and the second select gate line.

Before writing data to a selected memory cell in the memory cell array, the row decoder is controlled to, at a first timing, apply a voltage to the first select gate line, a selected word line which is the word line connected to the selected memory cell, and a word line disposed in a layer between the selected word line and the well region, to turn on transistors connected thereto, at a second timing after the first timing, change the voltage applied to the first select gate line to turn off the transistor to which the first select gate line is connected, and at a third timing after the second timing, change the voltage applied to the selected word line and the word line disposed between the selected word line and the well region to turn off the transistors connected thereto.

The source voltage control circuit applies a first voltage to the source line at a fourth timing that is simultaneous with or after the first timing and before the second timing. Further, the well voltage control circuit applies the first voltage to the well region at a fifth timing that is simultaneous with or after the first timing and before the second timing, and applies a ground voltage to the well region at a sixth timing that is after the fifth timing.

Embodiments will be described below with reference to the accompanying drawings.

First Embodiment (1. Configuration)

(1-1. Configuration of Nonvolatile Memory)

Figure 1:
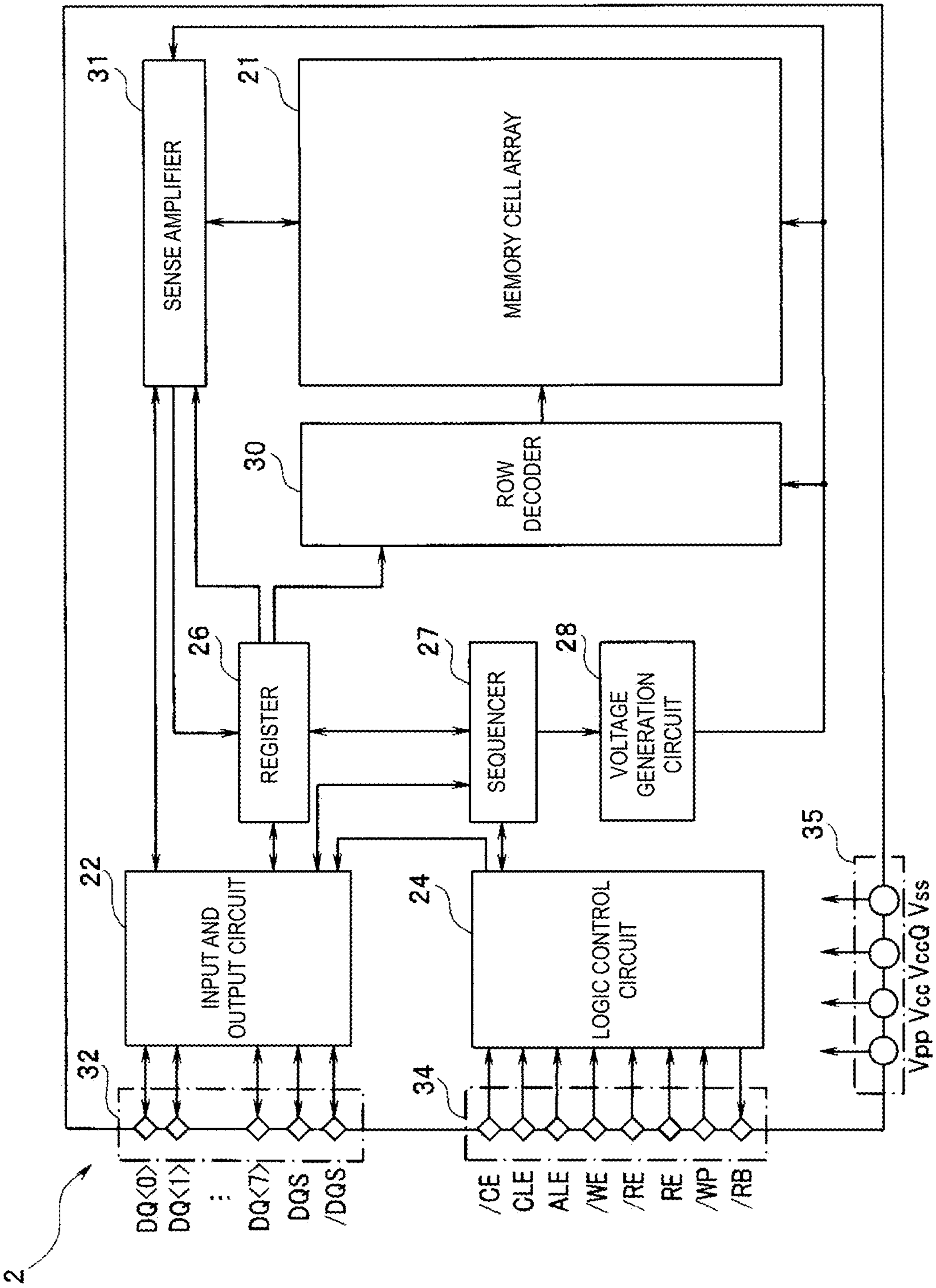
FIG. 1 is a block diagram showing a configuration example of a nonvolatile memory according to an embodiment.

FIG. 1 is a block diagram showing a configuration example of a nonvolatile memory according to the present embodiment. A nonvolatile memory 2 is a semiconductor memory device and includes a memory cell array 21, an input and output circuit 22, a logic control circuit 24, a register 26, a sequencer 27, a voltage generation circuit 28, a row decoder 30, a sense amplifier unit 31, an input and output pad group 32, a logic control pad group 34, and a power supply input terminal group 35.

The memory cell array 21 includes a plurality of non-volatile memory cell transistors (not shown) associated with word lines and bit lines.

The input and output circuit 22 transmits and receives a signal DQ <7:0>, as well as data strobe signals DOS and/DQS to and from an external memory controller (not shown). The input and output circuit 22 transfers a command and an address in the signal DQ <7:0> to the register 26. The input and output circuit 22 transmits and receives write data and read data to and from the sense amplifier unit 31.

The logic control circuit 24 receives a chip enable signal /CE, a command latch enable signal CLE, an address latch enable signal ALE, a write enable signal /WE, read enable signals RE, /RE, and a write protect signal /WP from the external memory controller (not shown). The logic control circuit 24 transfers a ready and busy signal /RB to the memory controller, to notify a state of the nonvolatile memory 2 to the outside.

The voltage generation circuit 28 generates a voltage necessary for operations such as writing, reading, and erasing data based on an instruction from the sequencer 27.

The row decoder 30 receives a block address and a row address in an address from the register 26, selects a corresponding block based on the block address, and selects a corresponding word line based on the row address.

When reading data, the sense amplifier unit 31 senses read data read from the memory cell transistor to the bit line, and transfers the sensed read data to the input and output circuit 22. When writing data, the sense amplifier unit 31 transfers write data to be written via the bit line to the memory cell transistor. The sense amplifier unit 31 includes a plurality of sense amplifiers SA.

The input and output pad group 32 includes a plurality of terminals (pads) corresponding to the signal DQ <7:0> and the data strobe signals DQS and/DQS for transmission and reception of signals including data to and from the external memory controller (not shown).

The logic control pad group 34 includes a plurality of terminals (pads) corresponding to the chip enable signal/CE, the command latch enable signal CLE, the address latch enable signal ALE, the write enable signal/WE, the read enable signals RE and/RE, and the write protect signal/WP for transmission and reception of signals to and from the external memory controller (not shown).

The power supply input terminal group 35 includes a plurality of terminals for inputting power supply voltages Vcc, VccQ, Vpp, and a ground voltage Vss in order to supply various operating power supply voltages from the outside to the nonvolatile memory 2. The power supply voltage Vcc is a circuit power supply voltage which is generally supplied from the outside, and, for example, a voltage of about 2.5 V is input. For example, a voltage of 1.2 V is input as the power supply voltage VccQ. The power supply voltage VccQ is used as a power supply for driving an input and output system for transmitting and receiving signals between the external memory controller (not shown) and the nonvolatile memory 2.

The power supply voltage Vpp is a power supply voltage higher than the power supply voltage Vcc, and, for example, a voltage of 12 V is input. For example, when the nonvolatile memory 2 is used in an environment in which a high-voltage power supply voltage cannot be supplied, a voltage is not supplied to the power supply voltage Vpp. Even when the power supply voltage Vpp is not supplied, the nonvolatile memory 2 can execute various operations as long as the power supply voltage Vcc is supplied. That is, the power supply voltage Vcc is the power supply voltage normally supplied to the nonvolatile memory 2, and the power supply voltage Vpp is a power supply voltage that is additionally and optionally supplied according to a use environment, for example.

The sense amplifier unit 31 detects data read from the memory cell array 21 at the time of reading data. At the time of writing data, the sense amplifier unit 31 temporarily stores the write data input from the memory controller (not shown) and transfers the write data to the memory cell array 21.

(1-2. Configuration of Memory Cell Array)

Figure 2:
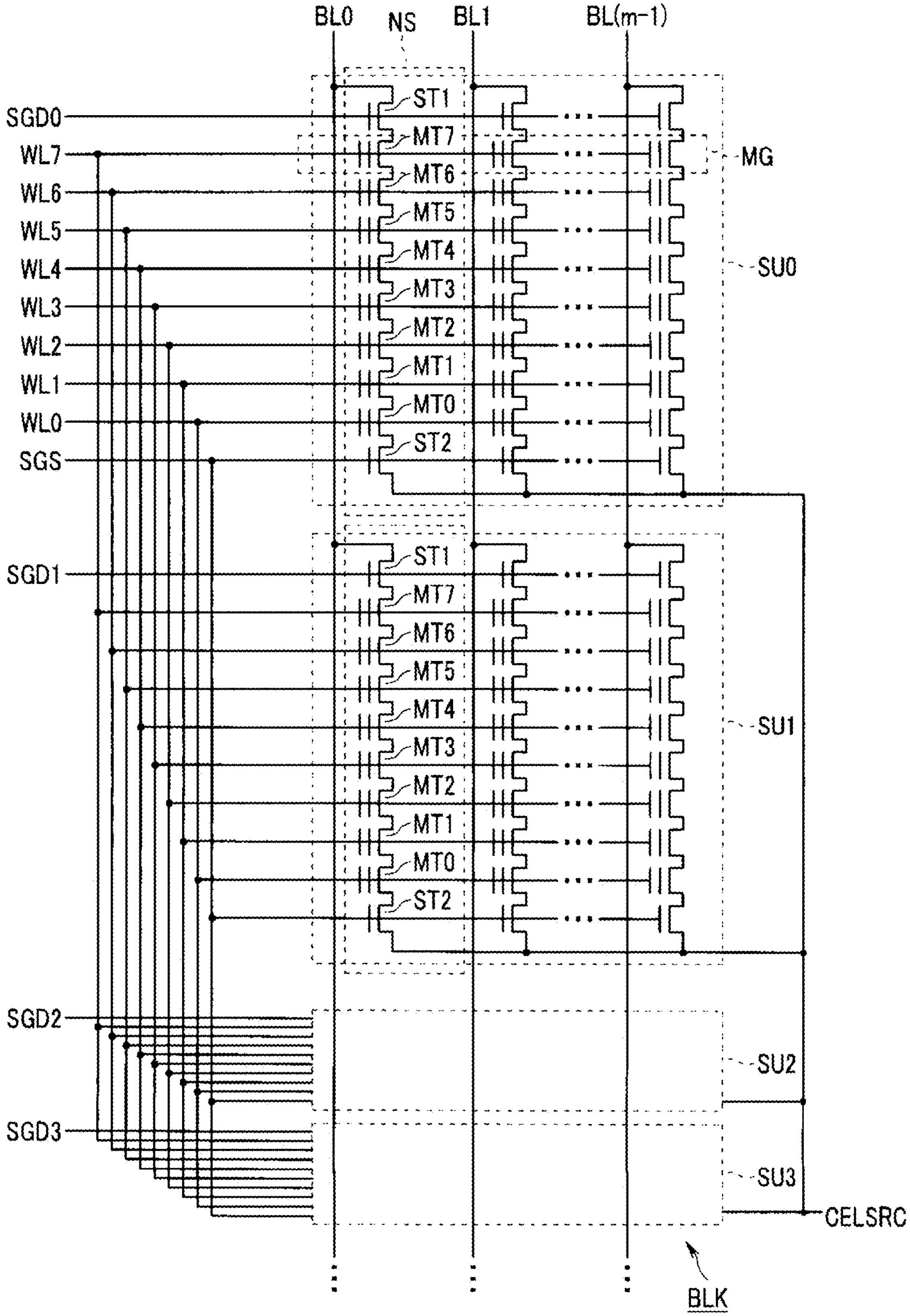
FIG. 2 is a diagram showing a circuit configuration example of a block of a memory cell array of a three-dimensional structure NAND memory.
Figure 3:
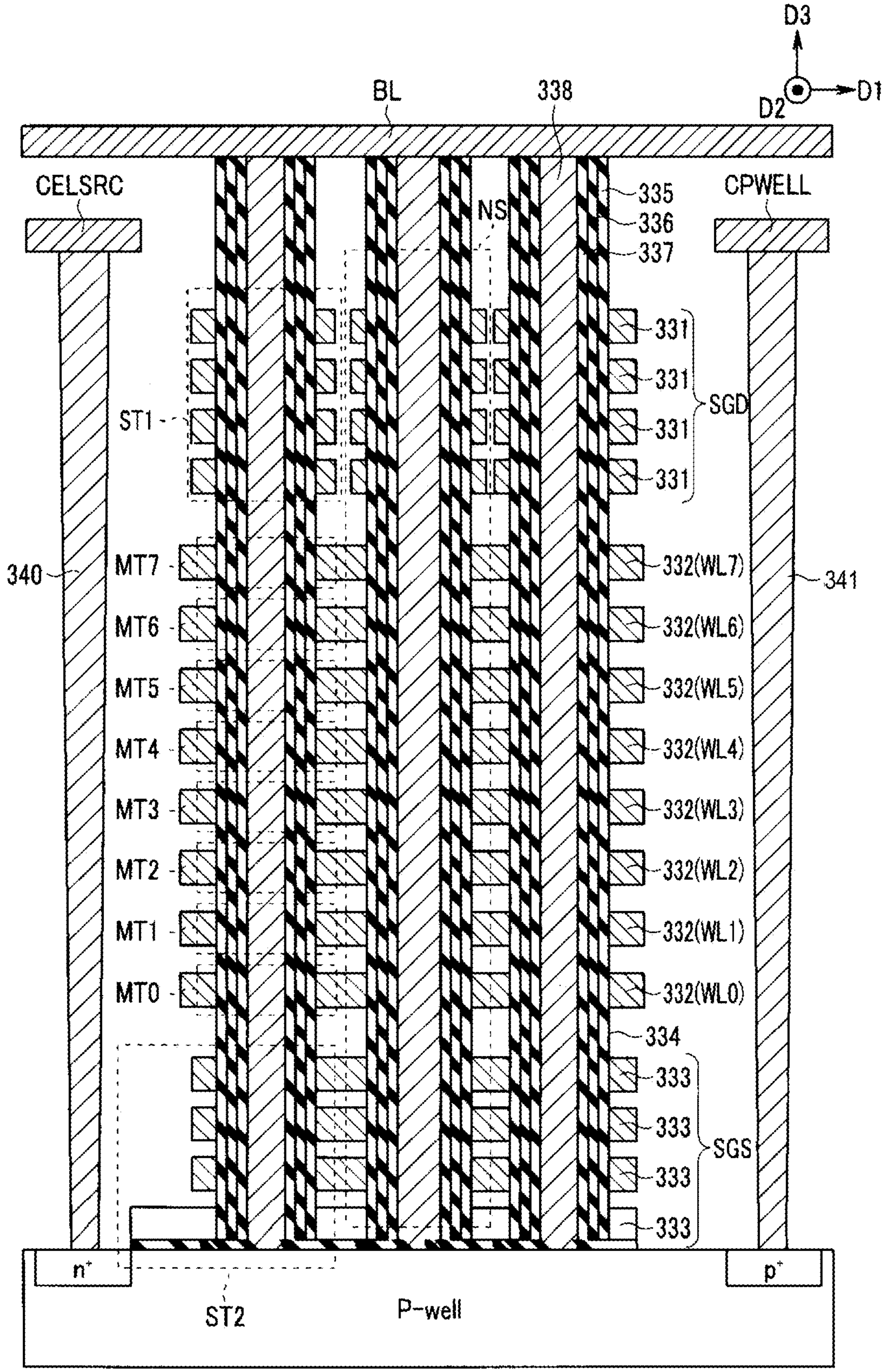
FIG. 3 is a cross-sectional view of the block of the memory cell array of the three-dimensional structure NAND memory.

The memory cell array 21 is a NAND memory having a three-dimensional structure and includes a plurality of blocks. FIG. 2 is a diagram showing a circuit configuration example of a block of the NAND memory. FIG. 3 is a cross-sectional view of the block of the NAND memory. Other blocks of the memory cell array 21 have the same circuit configuration as that of FIG. 2 and the same cross-sectional structure as that of FIG. 3.

As shown in FIG. 2, a block BLK includes, for example, four string units SU (SU0 to SU3). Each string unit SU includes a plurality of NAND strings NS. Each of the NAND strings NS includes, for example, eight memory cell transistors MT (MT0 to MT7) and select gate transistors ST1 and ST2. The memory cell transistor MT includes a gate and a charge storage layer, and stores data in a nonvolatile manner.

The number of memory cell transistors MT is not limited to eight, and may be, for example, 32, 48, 64, or 96. The select gate transistors ST1 and ST2 may have the same structure as the memory cell transistor. In addition, for example, a plurality of select gate transistors may be used as the select gate transistors ST1 and ST2 in order to increase a cutoff characteristic thereof. Further, a dummy cell transistor may be provided at ends of the memory cell transistors MT, such as between the memory cell transistors MT and the select gate transistors ST1 and ST2.

The memory cell transistors MT are connected in series between the select gate transistors ST1 and ST2. The memory cell transistor MT7 on one end side is connected to one end of the select gate transistor ST1, and the memory cell transistor MT0 on the other end side is connected to one end of the select gate transistor ST2.

Gates of the select gate transistors ST1 of the string units SU0 to SU3 are respectively connected to select gate lines SGD0 to SGD3. On the other hand, gates of the select gate transistors ST2 are commonly connected to the same select gate line SGS across a plurality of string units SU in the same block BLK. Control gates of the memory cell transistors MT0 to MT7 in the same block BLK are respectively connected to the common word lines WL0 to WL7. That is, the word lines WL0 to WL7 and the select gate line SGS are commonly connected among the plurality of string units SU0 to SU3 in the same block BLK, whereas the select gate line SGD is independent for each of the string units SU0 to SU3 even in the same block BLK.

The word lines WL0 to WL7 are respectively connected to control gate electrodes of the memory cell transistors MT0 to MT7 forming a NAND string NS, and the memory cell transistors MTi (i=0 to n) in each NAND string NS are commonly connected by the same word line WLi (i=0 to n). That is, the control gate electrodes of the corresponding memory cell transistors MTi (those having the same height in a D3 direction in FIG. 3) in each NAND string NS in the block BLK are connected to the same word line WLi. In the following description, the NAND string NS may be simply referred to as a "string".

The other end of the select gate transistor ST1 of the NAND string NS (end on the side not connected to the memory cell transistor MT7) is connected to any one of m bit lines. The bit line BL is commonly connected to one of the NAND strings NS in the string units SU0 to SU3 in the same block BLK. The bit line BL is commonly connected to a corresponding NAND string NS across the plurality of blocks BLK. The other end of the select gate transistor ST2 (end on the side not connected to the memory cell transistor MT0) is connected to a source line CELSRC. The source line CELSRC is commonly connected to the plurality of NAND strings NS across the plurality of blocks BLK.

As described above, data of the memory cells (memory cell transistors MT) in the same block BLK is collectively erased. On the other hand, read operation and write operation of the data is performed in memory cell group MG units (or page units). In the present specification, a plurality of memory cells connected to one word line WLi and belonging to one string unit SU are defined as a memory cell group MG. During the read operation and the write operation, one word line WLi and one select gate line SGD are selected according to a physical address, and the memory cell group MG is thereby selected.

In FIG. 3, a D1 direction corresponds to an extending direction of the bit line BL, a D2 direction corresponds to an extending direction of the word line WL and the select gate lines SGD and SGS, and the D3 direction corresponds to a stacking direction of the word line WL and the select gate lines SGD and SGS. The D1 direction is parallel to a surface of a semiconductor substrate 100, the D2 direction is parallel to the surface of the semiconductor substrate 100 and orthogonal to the D1 direction, and the D3 direction is perpendicular to the surface of the semiconductor substrate 100 and orthogonal to the D1 direction and the D2 direction.

As shown in FIG. 3, a plurality of NAND strings NS are formed on a p-type well region (P-well). That is, a plurality of wiring layers 333 functioning as the select gate line SGS, a plurality of wiring layers 332 functioning as the word line WLi, and a plurality of wiring layers 331 functioning as the select gate line SGD are stacked on the p-type well region.

A memory hole 334 which penetrates the wiring layers 333, 332, and 331 and reaches the p-type well region is formed. A block insulating film 335, a charge storage layer 336, and a gate insulating film 337 are sequentially formed on a side surface of the memory hole 334, and a conductive pillar 338 is further embedded in the memory hole 334. The conductive pillar 338 is formed of, for example, polysilicon, and functions as a region where a channel is formed during operation of the memory cell transistor MT and select gate transistors ST1 and ST2 in the NAND string NS.

In each NAND string NS, a select gate transistor ST2, a plurality of memory cell transistors MT, and a select gate transistor ST1 are formed on the p-type well region. A wiring layer functioning as the bit line BL is formed above the conductive pillar 338. The bit line BL is connected to an upper side of the conductive pillar 338.

Further, an n+ type impurity diffusion layer and a p+ type impurity diffusion layer are formed within the surface of the p-type well region. A contact plug 340 is formed on the n+ type impurity diffusion layer, and a wiring layer functioning as the source line CELSRC is formed on the contact plug 340. A contact plug 341 is formed on the p+ type impurity diffusion layer, and a wiring layer functioning as a well line CPWELL is formed on the contact plug 341.

A plurality of the structure shown in FIG. 3 above is arranged in a depth direction (D2 direction) of a paper surface of FIG. 3, and one string unit SU is formed by a set of the plurality of NAND strings arranged along a line extending in the depth direction.

(1-3. Voltage Supply to Wiring of Memory Cell Array)

Figure 4:
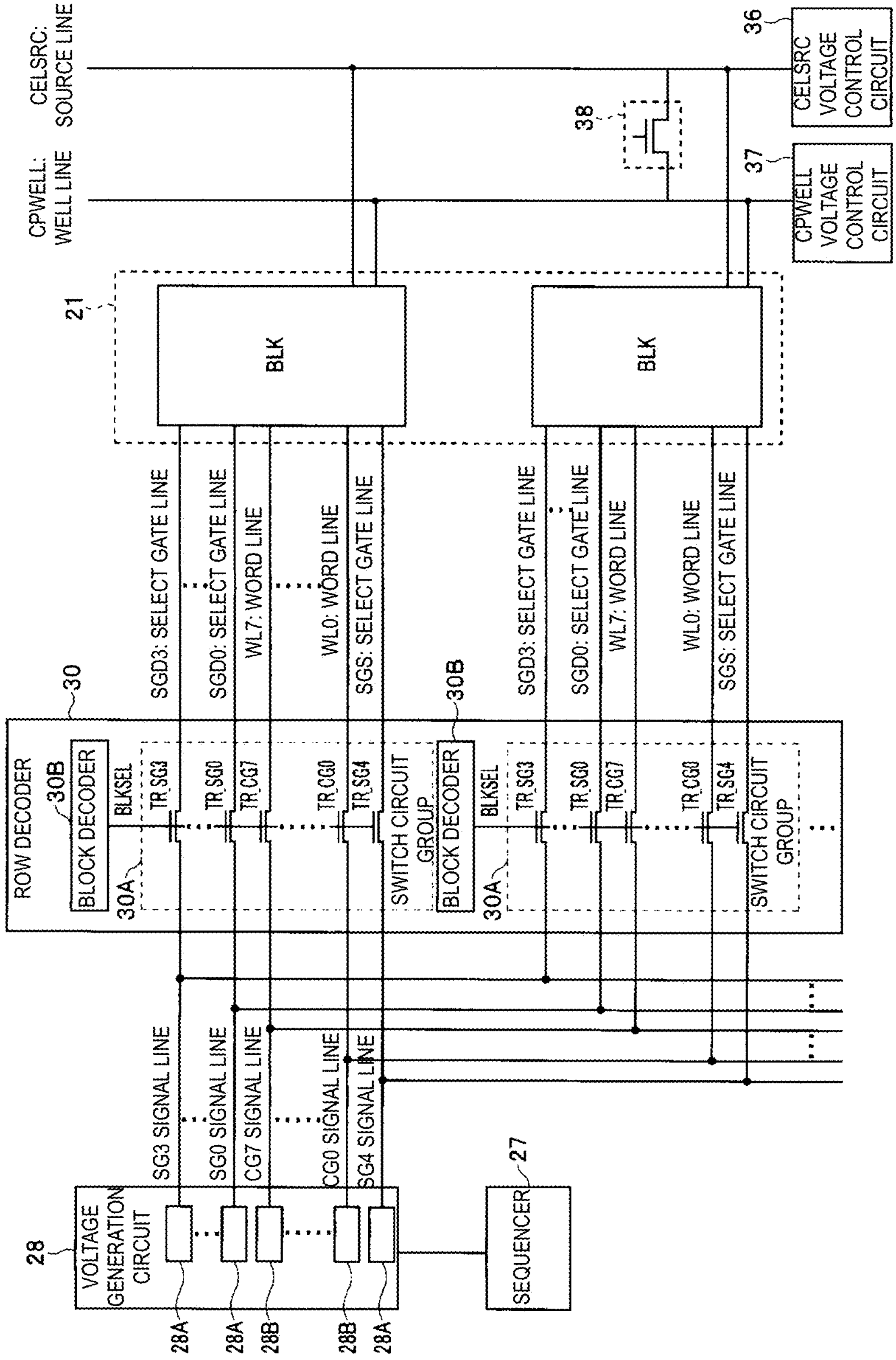
FIG. 4 is a block diagram showing voltage supply paths to wirings of the memory cell array.

FIG. 4 is a block diagram illustrating voltage supply paths to the wiring of the memory cell array. The voltage generation circuit 28 includes a plurality of SG drivers 28A that supply voltages to respective signal lines SG0 to SG4, and a plurality of CG drivers 28B that supply voltages to respective signal lines CG0 to CG7. The signal lines SG0 to SG4 and CG0 to CG7 are connected to the wiring of each block BLK through the row decoder 30. That is, the signal lines SG0 to SG3 function as global drain side select gate lines, and are connected to the select gate lines SGD0 to SGD3 that function as local select gate lines in each block BLK through the row decoder 30. The signal lines CG0 to CG7 function as global word lines and are connected to the word lines WL0 to WL7 that function as local word lines in each block BLK through the row decoder 30. The signal line SG4 functions as a global source side select gate line, and is connected to the select gate line SGS that functions as a local select gate line in each block BLK through the row decoder 30.

The voltage generation circuit 28 is controlled by the sequencer 27 to generate various voltages. The SG drivers (also referred to as select gate line drivers) 28A and the CG drivers (also referred to as word line drivers) 28B supply various generated voltages to the corresponding signal lines SG0 to SG4 and the signal lines CG0 to CG7, respectively.

For example, each CG driver 28B selects and supplies any one of a voltage VPGM and a voltage VPASS in accordance with the corresponding signal line CG and the word line WL according to the target of the write operation (e.g., row address). The CG driver 28B connected to the signal line CG corresponding to the word line WLn to be subjected to the write operation supplies the voltage VPGM. The CG drivers 28B connected to the signal lines CGn±1, CGn±2, and the like corresponding to other word lines WLn±1, WLn±2, and the like supply the voltage VPASS. The voltage VPASS is a voltage for turning on the memory cell transistor MT. The voltage VPGM is a voltage for injecting electrons into the charge storage layer by a tunneling phenomenon, and VPGM>VPASS.

The row decoder 30 includes a plurality of switch circuit groups 30A corresponding to each block respectively, and a plurality of block decoders 30B provided respectively corresponding to the plurality of switch circuit groups 30A. Each switch circuit group 30A includes a plurality of transistors TR_SG0 to TR_SG3 respectively connecting the signal lines SG0 to SG3 and the select gate lines SGD0 to SGD3, a plurality of transistors TR_CG0 to TR_CG7 respectively connecting the signal lines CG0 to CG7 and the word lines WL0 to WL7, and a transistor TR_SG4 connecting the signal line SG4 and the select gate line SGS. Each of the transistors TR_SG0 to TR_SG4 and the transistors TR_CG0 to TR_CG7 is a high breakdown voltage transistor.

Each block decoder 30B supplies a block select signal BLKSEL to the gates of the transistors TR_SG0 to TR_SG4 and the transistors TR_CG0 to TR_CG7 according to the row address. Accordingly, in the switch circuit group 30A to which the block select signal BLKSEL is supplied from the block decoder 30B in accordance with the row address, since the transistors TR_SG0 to TR_SG4 and transistors TR_CG0 to TR_CG7 are turned on and become conductive, the voltages supplied from the voltage generation circuit 28 to the signal lines SG0 to SG4 and the signal lines CG0 to CG7 are supplied respectively to the select gate lines SGD0 to SGD3, SGS and the word lines WL0 to WL7 in the block BLK to be operated.

That is, a write voltage VPGM is supplied to the selected word line WLn, and the voltage VPASS is supplied to other non-selected word lines WLn±1 and WLn±2 by the voltage generation circuit 28 and the row decoder 30. Further, for example, a voltage VSG1 is supplied to the select gate line SGD (SGD_sel) connected to the select gate transistor ST1 that is in the string unit SU to be operated, a voltage VSG2 is supplied to the select gate line SGD (SGD_usel) connected to the select gate transistor ST1 that is not in the string unit SU to be operated, and a voltage VSG3 is supplied to the select gate line SGS that is collectively connected to the select gate transistor ST2 in each string unit SU in the block BLK. The voltage generation circuit 28 and the row decoder 30 function as a row voltage control unit.

The voltage VSG1 is a voltage that turns on the select gate transistor ST1 connected to a bit line BL to which "0" data is given, and is a voltage that cuts off the select gate transistor ST1 connected to a bit line BL to which "1" data is given. In the program operation, operation of increasing a threshold voltage of the memory cell transistor MT is called "0" program" or "0" write", and the "0" data is given to the bit line BL to be subjected to the "0" program. On the other hand, operation of maintaining a threshold voltage of the memory cell transistor MT is called "1" program", "1" write", or "write inhibit", and the "1" data is given to the bit line BL to be subjected to the "1" program. A ground voltage Vss (for example, 0 V) is applied to the bit line BL to which the "0" data is given, as an "L" level. An "H" level, for example, 2.5 V is applied to the bit line BL to which the "1" data is given.

The voltage VSG2 is a voltage (for example, the ground voltage Vss) for turning off the select gate transistor ST1. The voltage VSG3 is a voltage (for example, the ground voltage Vss) for turning off the select gate transistor ST2.

A CELSRC voltage control circuit 36 receives a power supply voltage Vcc from the power supply input terminal group 35 and controls the voltage supplied to the source line CELSRC. The source line CELSRC is commonly connected to each block BLK. A CPWELL voltage control circuit 37 receives the ground voltage Vss from the power supply input terminal group 35, and supplies the ground voltage Vss to the well line CPWELL. The well line CPWELL is also commonly connected to each block BLK. The source line CELSRC and the well line CPWELL are connected by an output end connection transistor 38. The CPWELL voltage control circuit 37 and the output end connection transistor 38 function as well voltage control units.

The output end connection transistor 38 is turned on when the voltage of the well line CPWELL is increased to the same value as the voltage of the source line CELSRC. That is, when the voltage of the well line CPWELL is increased to the same value as the voltage of the source line CELSRC, the output end connection transistor 38 is turned on to short-circuit the source line CELSRC and the well line CPWELL. Since a coupling capacitance between the source line CELSRC and the well line CPWELL cannot be seen by short-circuiting, voltage increase of the source line CELSRC can be accelerated. The CELSRC voltage control circuit 36 functions as a source voltage control unit.

(1-4. Threshold Voltage Distribution of Memory Cell Transistor)

Figures 12, 13:
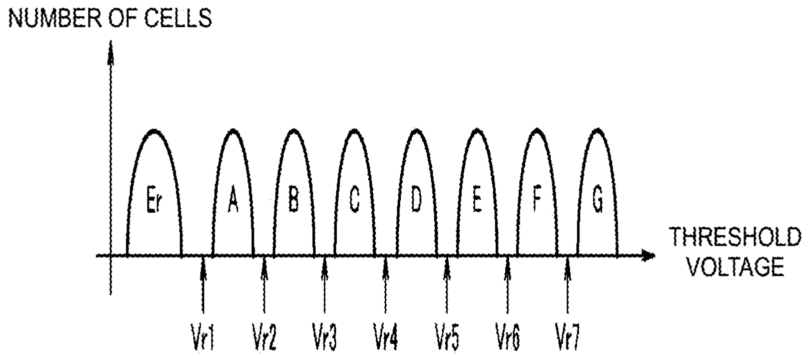
FIG. 12 shows a threshold voltage distribution example of a 3-bit per cell nonvolatile memory.
FIG. 13 is a diagram showing data coding according to embodiments.

FIG. 12 is a diagram showing an example of a threshold voltage region according to the present embodiment. FIG. 12 shows a threshold voltage distribution example of the nonvolatile memory 2 in which 3 bits are stored per memory cell. In the nonvolatile memory 2, information is stored in accordance with a charge amount stored in a charge storage film of the memory cell. Each memory cell has a threshold voltage corresponding to the charge amount. Then, a plurality of data values stored in the memory cell are respectively associated with a plurality of regions (threshold voltage regions) of the threshold voltage.

Eight distributions (lobe shapes), herein referred to as Er, A, B, C, D, E, F, and G states, are shown in FIG. 12. They correspond to respective threshold voltage distributions within the eight threshold voltage regions. In this way, each memory cell has a threshold voltage distribution partitioned by seven boundaries. A horizontal axis of FIG. 12 indicates a threshold voltage, and a vertical axis indicates a distribution of the number of memory cells.

In the present embodiment, a memory cell having a threshold voltage that is Vr1 or less is in the Er state, a memory cell having a threshold voltage that is higher than Vr1 and equal to or lower than Vr2 is in the A state, a memory cell having a threshold voltage that is higher than Vr2 and equal to or lower than Vr3 is in the B state, and a memory cell having a threshold voltage that is higher than Vr3 and equal to or lower than Vr4 is in the C state. Further, in the present embodiment, a memory cell having a threshold voltage that is higher than Vr4 and equal to or lower than Vr5 is in the D state, a memory cell having a threshold voltage that is higher than Vr5 and equal to or lower than Vr6 is in the E state, a memory cell having a threshold voltage that is higher than Vr6 and equal to or lower than Vr7 is in the F state, and a memory cell having a threshold voltage that is higher than Vr7 is in the G state.

Vr1 to Vr7 are threshold voltages serving as boundaries between adjacent states.

In the nonvolatile memory 2, a plurality of data values are respectively associated with the plurality of states of the memory cell. The correspondence is referred to as data coding. The data coding is determined in advance, and at the time of writing (programming) data, charges are injected into the memory cell so that the threshold voltage of the memory cell will be in a state corresponding to a data value to be stored according to the data coding. At the time of reading, a read voltage is applied to the memory cell, and the data is determined based on whether the threshold voltage of the memory cell is lower or higher than the read voltage.

FIG. 13 is a diagram showing data coding according to the present embodiment. In the present embodiment, the eight states shown in FIG. 12 correspond to eight data values of 3-bit, respectively. A relationship between the threshold and the data values of the bits corresponding to upper, middle, and lower pages is as follows.

The memory cell whose threshold voltage is in the Er state stores "111".

The memory cell whose threshold voltage is in the A state stores "101".

The memory cell whose threshold voltage is in the B state stores "001".

The memory cell whose threshold voltage is in the C state stores "011".

The memory cell whose threshold voltage is in the D state stores "010".

The memory cell whose threshold voltage is in the E state stores "110".

The memory cell whose threshold voltage is in the F state stores "100".

The memory cell whose threshold voltage is in the G state stores "000".

Figure 6:
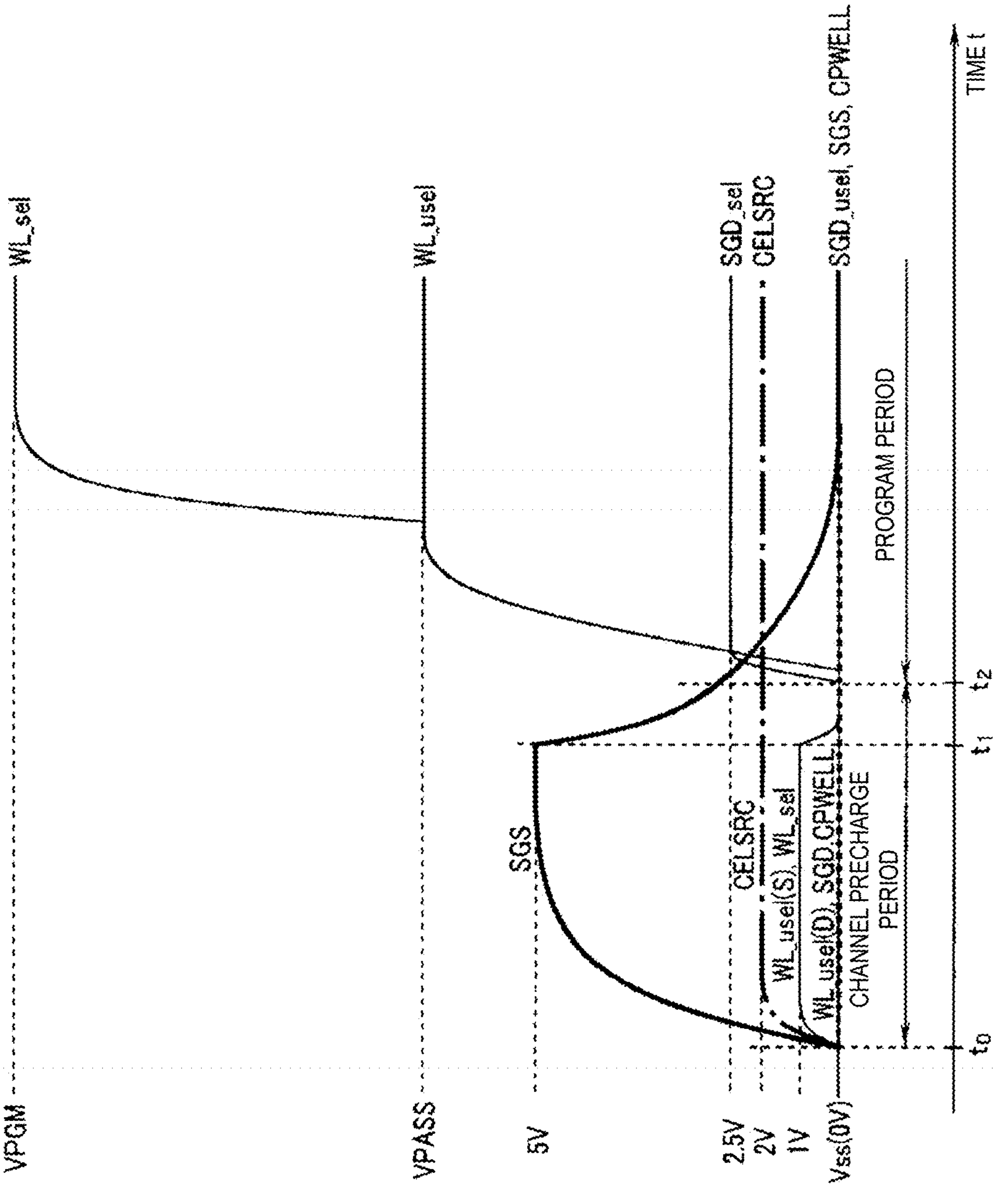
FIG. 6 is a diagram showing a voltage change in various wirings during channel precharge operation and program operation in a comparative example.

In this manner, a 3-bit data can be stored in each memory cell. When the memory cell is in an unwritten state ("erase" state), the threshold voltage of the memory cell is in the Er state. In addition, in the data coding described herein, the data changes by only one bit between any two adjacent states, e.g., the data "111" corresponds to the Er (erase) state, and the data "101" corresponds to the state A. In this way, the data coding shown in FIG. 6 is a gray code in which data changes by only one bit between any two adjacent states.

(2. Operation)

(2-1. Specific Example of Write Operation)

First, write operation according to the present embodiment will be briefly described. The write operation includes program operation and verify operation.

The program operation is an operation of increasing the threshold voltage by injecting electrons into the charge storage layer (or maintaining the threshold voltage by inhibiting injection). In the following, the operation of increasing the threshold voltage is called a "0" program" or "0" write", and the "0" data is given to the bit line BL to be subjected to the "0" program. On the other hand, the operation of maintaining the threshold voltage is called "1" program", "1" write", or "write inhibit", and the "1" data is given to the bit line BL to be subjected to the "1" program.

The verify operation is an operation of determining whether or not the threshold voltage of the memory cell transistor MT reaches a target state by reading the data after the program operation. Thereafter, the memory cell transistor MT whose threshold voltage reaches the target state is inhibited from being written.

By repeating a combination of the program operation and the verify operation described above, the threshold voltage of the memory cell transistor MT is increased to the target state.

Figure 14:
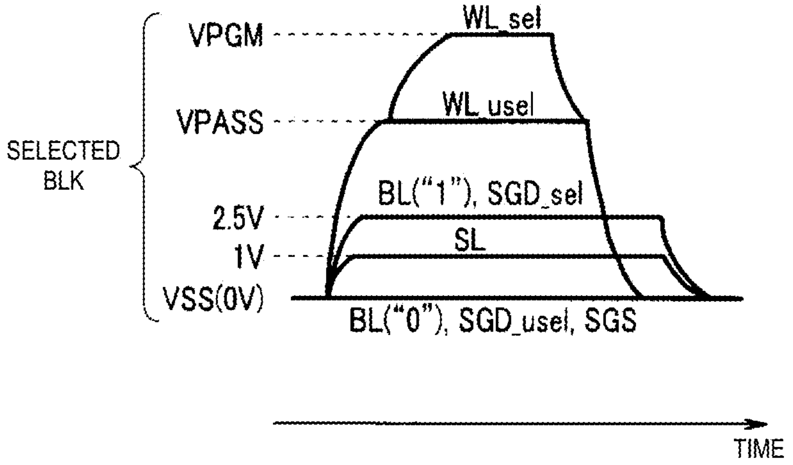
FIG. 14 is a diagram showing a voltage change in various wirings during the program operation.

FIG. 14 is a diagram showing a voltage change in various wirings during the program operation. As shown in the drawing, program data is transferred to each bit line BL. Specifically, the ground voltage Vss (for example, 0 V) is applied as "L" level to the bit line BL to which the "O" data is given, and the "H" level, for example, 2.5 V is applied to the bit line BL to which the "1" data is given.

A voltage of the select gate line SGD_sel in a selected string unit SU_sel in a selected block BLK is set to 2.5 V, for example. The voltage at this level turns on the select gate transistor ST1 corresponding to the bit line BL to which the "0" data (0 V) is given, but cuts off the select gate transistor ST1 corresponding to the bit line BL to which the "1" data (2.5 V) is given. On the other hand, the voltage Vss is applied to the select gate line SGD_usel in a non-selected string unit SU_usel in the selected block BLK, and the select gate transistor ST1 in the non-selected string unit SU_usel is turned off. The voltage Vss is also applied to the select gate line SGS in the selected block BLK, and the select gate transistor ST2 is turned off.

Then, the voltage VPGM is applied to the selected word line WL_sel in the selected block BLK, and the voltage VPASS is applied to other non-selected word lines WL_usel. The voltage VPGM is a voltage for injecting electrons into the charge storage layer by a tunneling phenomenon, and VPGM>VPASS.

Figure 15:
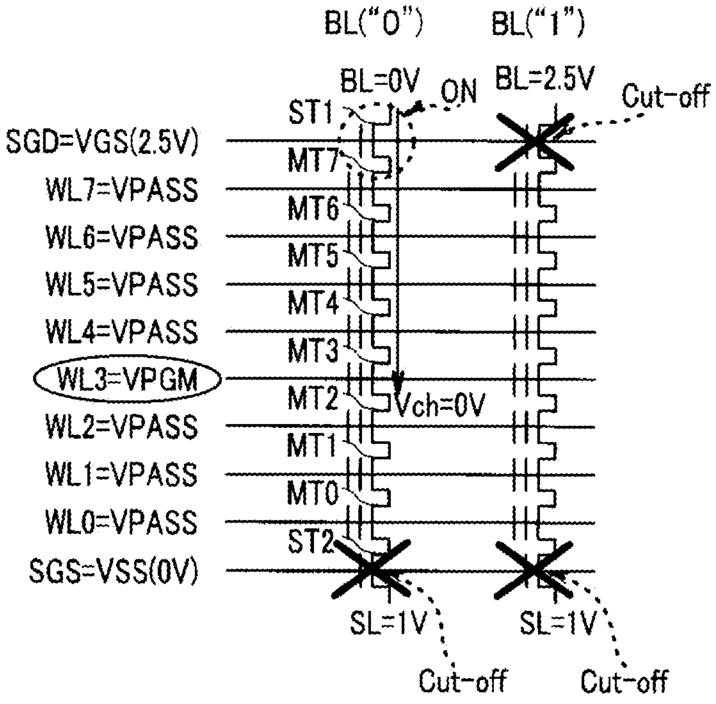
FIG. 15 is a circuit diagram showing a state of a string unit during the program operation.

FIG. 15 shows a state of the string unit SU in the program operation. In FIG. 15, two NAND strings corresponding to the bit line BL subjected to the "0" program operation and the bit line BL subjected to the "1" program operation are illustrated. Since a word line WL3 is selected, a voltage VPGM is applied to the selected word line WL3, and the voltage VPASS is applied to the non-selected word lines WL0 to WL2 and WL4 to WL7.

In the NAND string corresponding to the bit line BL subjected to the "0" program operation, the select gate transistor ST1 is turned on. Therefore, a channel voltage Vch of the memory cell transistor MT3 connected to the selected word line WL3 is 0 V. Therefore, a voltage difference between a gate and a channel becomes large, and as a result, electrons are injected into the charge storage layer, and the threshold voltage of the memory cell transistor MT3 is increased.

On the other hand, in the NAND string corresponding to the bit line BL subjected to the "1" program operation, the select gate transistor ST1 is cut off. Therefore, the channel of the memory cell transistor MT3 connected to the selected word line WL3 becomes electrically floating, and the channel voltage Vch is boosted due to capacitance coupling with the word line WL and the like. Therefore, the voltage difference between the gate and the channel is reduced, and as a result, the electrons are not injected into the charge storage layer, and the threshold voltage of the memory cell transistor MT3 is maintained.

(2-2. Sequence of Write Operation)

Next, a sequence of the write operation of the present embodiment will be described. FIGS. 16 and 17 show an example in which the data is written by repeating the combination of the program operation and the verify operation 19 times. The repetitive operation is referred to as a "loop".

FIG. 16 shows a target state of the verify operation performed in each loop. As shown in the drawing, in first and second loops, the verify operation is performed only on the "A" state. That is, a voltage VfyA is applied to the selected word line WL during the verify operation, and voltages VfyB to VfyG are not applied. Subsequently, in third and fourth loops, the verify operation is performed on the "A" state and a "B" state. That is, the voltages VfyA and VfyB are sequentially applied to the selected word line WL during the verify operation, and the voltages VfyC to VfyG are not applied.

In fifth and sixth loops, the verify operation is performed on the "A" state, the "B" state, and a "C" state. That is, the voltages VfyA, VfyB, and VfyC are sequentially applied to the selected word line WL during the verify operation, and the voltages VfyD to VfyG are not applied. Then, the verify operation is last performed on the "A" state in the sixth loop. This is because, for example, it is empirically expected that the program to the "A" state will be completed by the number of loops of 6 times.

In seventh and eighth loops, the verify operation is performed on the "B" state, the "C" state, and a "D" state. That is, the voltages VfyB, VfyC, and VfyD are sequentially applied to the selected word line WL during the verify operation. Then, the verify operation is last performed on the "B" state in the eighth loop. Further, in ninth and tenth loops, the verify operation is performed on the "C" state, the "D" state, and an "E" state. That is, the voltages VfyC, VfyD, and VfyE are sequentially applied to the selected word line WL during the verify operation. Then, the verify operation is last performed on the "C" state in the tenth loop.

Thereafter, the write up to the "G" state is similarly performed, and the loop is repeated up to 19 times.

FIG. 17 corresponds to FIG. 16, and shows a state of a bit line corresponding to a target state of a threshold voltage in each loop. In FIG. 17, a notation "1" means that "1" data is given to the corresponding bit line BL, and a notation "0" means that "0" data is given.

As shown in the drawing, when the threshold voltage of the memory cell transistor MT is to be maintained at the "Er" state, the "1" data is given to the bit line BL over all the loops. That is, the select gate transistor ST1 is always in the cut off state during the entire write operation.

When the target state of the threshold voltage is at the "A" state, that is, for the memory cell transistor MT whose threshold voltage is to be increased from a value in the "Er" state to a value in the "A" state, the "0" program operation can be performed in first to sixth loops. The "0" data is given to the bit line BL until the verify operation is passed, and the "1" data is given after passing the verify operation. Also, in a seventh and subsequent loops after the program operation is completed, the "1" data is given to the bit line BL, and the write is inhibited.

When the target state is at the "B" state, that is, for the memory cell transistor MT whose threshold voltage is to be increased from a value in the "Er" state to a value in the "B" state, the "0" program operation can be performed in the first to eighth loops. In the third to eighth loops, the "0" data is given to the bit line BL until the verify operation is passed, and the "1" data is given after passing the verify operation. Also, in a ninth and subsequent loops after the program operation is completed, the "1" data is given to the bit line BL, and the write is inhibited.

Thereafter, the program operation from the "C" to the "G" state is performed in the same manner.

Figure 18:
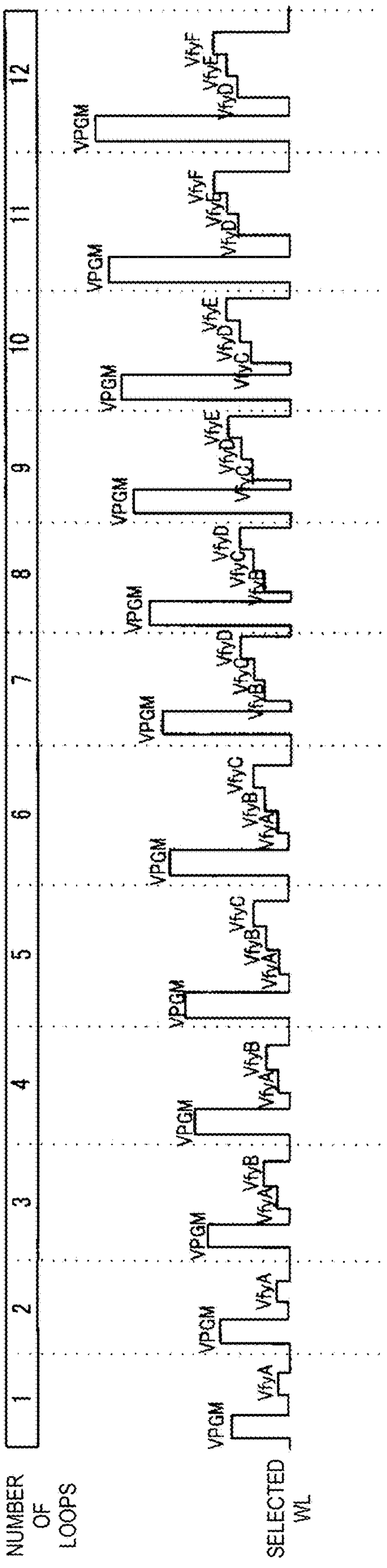
FIG. 18 is a timing chart showing a voltage of a selected word line in the sequence of the write operation.

FIG. 18 shows a state of the voltage of the selected word line during the above operation. In each loop, the voltage VPGM is applied to the selected word line WL to execute the program operation, and then the verify operation is executed by applying the voltages VfyA to VfyG corresponding to the states previously associated with the loops.

(2-3. Data Write Order)

Next, a data write order in the above NAND memory cell array 21 will be described. FIGS. 5A and 5B are diagrams showing a data write order. FIG. 5A shows a write order when writing data from a source side to a drain side, and FIG. 5B shows a write order when writing data from the drain side to the source side.

As shown in FIG. 5A, when writing data from the source side to the drain side, write operation is first executed on the memory cell group MG corresponding to the word line WL0 in the string unit SU0. Specifically, in the program operation, a voltage VSG1 is applied to the select gate line SDG0, and a voltage VSG2 is applied to the select gate lines SDG1 to SGD3. The voltage VPGM is applied to the selected word line WL0, and the voltage VPASS is applied to the non-selected word lines WL1 to WL7. Next, the write operation is executed on the memory cell group MG corresponding to the word line WL0 in the string unit SU1. Specifically, in the program operation, the voltage VSG1 is applied to the select gate line SDG1, and the voltage VSG2 is applied to the select gate lines SDG0, SDG2, and SGD3. The voltage VPGM is applied to the selected word line WL0, and the voltage VPASS is applied to the non-selected word lines WL1 to WL7. Subsequently, similarly, the memory cell group MG corresponding to the word line WL0 in the string unit SU2 and the memory cell group MG corresponding to the word line WL0 in the string unit SU3 are sequentially written in.

When the write of the word lines WL0 of all the string units SU in the selected block BLK is completed, processing proceeds to the write of the word line WL1. Similarly to the write of the word lines WL0, the write of the word lines WL1 is also performed in the order of the string unit SU0 to the string unit SU1, to the string unit SU2, and to the string unit SU3. As described above, the write is sequentially performed from the word line WL0 located on the source side (lower side in the D3 direction) toward the word line WL7 located on the drain side (upper side in the D3 direction).

On the other hand, as shown in FIG. 5B, when writing data from the drain side to the source side, the write operation is first executed on the memory cell group MG corresponding to the word line WL7 in the string unit SU0. Specifically, in the program operation, the voltage VSG1 is applied to the select gate line SDG0, and the voltage VSG2 is applied to the select gate lines SDG1 to SGD3. The voltage VPGM is applied to the selected word line WL7, and the voltage VPASS is applied to the non-selected word lines WL0 to WL6. Next, the write operation is executed on the memory cell group MG corresponding to the word line WL7 in the string unit SU1. Specifically, in the program operation, the voltage VSG1 is applied to the select gate line SDG1, and the voltage VSG2 is applied to the select gate lines SDG0, SDG2, and SGD3. The voltage VPGM is applied to the selected word line WL7, and the voltage VPASS is applied to the non-selected word lines WL0 to WL6. Subsequently, similarly, the memory cell group MG corresponding to the word line WL7 in the string unit SU2 and the memory cell group MG corresponding to the word line WL7 in the string unit SU3 are sequentially written in.

When the write of the word lines WL7 of all the string units SU in the selected block BLK is completed, processing proceeds to the write of the word lines WL6. Similarly to the write of the word line WL7, the write of the word line WL6 is also performed in the order of the string unit SU0 to the string unit SU1, to the string unit SU2, and to the string unit SU3. As described above, the write is sequentially performed from the word line WL7 located on the drain side (upper side in the D3 direction) toward the word line WL0 located on the source side (lower side in the D3 direction).

(2-4. Channel Precharge Operation)

The memory cell array 21 of the present embodiment has a three-dimensional structure, and as shown in FIG. 3, each NAND string NS is formed in a pillar shape in the memory hole 334. Therefore, the channels of the memory cell transistors MT in each NAND string NS may vary.

Therefore, when the program operation for a certain memory cell group MG is executed, the channel boost in the NAND string NS corresponding to the bit line BL to be subjected to the "1" program operation may be influenced by the voltage of the channel of the memory cell transistor MT. Particularly, when the channel of the memory cell transistor MT has a negative voltage (e.g., smaller than the ground voltage Vss) at the start of the program operation, even if the channel voltage is boosted by capacitance coupling, the voltage difference between the channel and the gate of the memory cell transistor MT may be larger than the voltage difference necessary for injecting the electrons from the channel into the charge storage layer. That is, erroneous write (e.g., program disturb) to the memory cell transistor MT which is not a target of the program operation may occur.

As shown in FIGS. 2 and 3, in the memory cell array 21 of the three-dimensional structure of the present embodiment, a plurality of string units SU are provided in one block BLK, and each word line is commonly connected to a plurality of string units SU. Therefore, a string unit SU in which the memory cell group MG that is the target of the write operation is present (selected string unit SU_sel), and a string unit SU in which the memory cell group MG that is the target of the write operation is not present (non-selected string unit SU_usel) are both in the selected block BLK.

In the write operation, since the voltage VSG2 is applied to the select gate line SDG corresponding to the non-selected string unit SU_usel, the select gate transistor ST1 is turned off. Since the voltage VSG3 is applied to the select gate line SGS of the selected block BLK, the select gate transistor ST2 is turned off. That is, the channels of the NAND strings NS in the non-selected string unit SU_usel are in a floating state with independent voltages. In this state, when the voltage VPGM is applied to the selected word line WLn, the voltages of the channel of the NAND string NS in the non-selected string unit SU_usel are boosted by the capacitance coupling.

Accordingly, the voltage difference between the gate of the memory cell transistor MT in the non-selected string unit SU_usel and the channel of the NAND string NS is reduced to be small so that the write is not performed.

However, for the NAND string NS in the non-selected string unit SU_usel, when the channel of the memory cell transistor MT has a negative voltage at the start of the program operation, even if the channel voltage is boosted by capacitance coupling, the voltage difference between the channel and the gate of the memory cell transistor MT may be larger than the voltage difference necessary for injecting the electrons from the channel into the charge storage layer. That is, the erroneous write (program (disturb) to the memory cell transistor MT of the non-selected string unit SU_usel may occur.

In order to prevent the program disturb, before the voltage VPGM is applied to the selected word line WL_sel, it is conceivable to perform operation of stabilizing an initial voltage of the channel of the NAND string NS in the non-selected string unit SU_usel (channel precharge operation).

As a method of increasing the initial voltage of the channel, for example, there are a method of applying a voltage from the bit line BL (channel precharge operation from the bit line side), and a method of applying a voltage from the source line CELSRC (channel precharge from the source line side).

When the voltage is applied from the source line CELSRC, the select gate transistor ST2 is turned on, and the memory cell transistor MT connected to the word lines WL0 to WLn is turned on. When the write is performed on the memory cell transistors MT connected to the word lines WL0 to WLn and the threshold voltage increases, it is necessary to apply a high voltage (for example, 8 V) to the word lines WL0 to WLn so that the word lines WL0 to WLn are always turned on regardless of the threshold voltage of the memory cell transistor MT. On the other hand, when the memory cell transistors MT connected to the word lines WL0 to WLn are not written and the threshold voltage does not increase, the voltage applied to the word lines WL0 to WLn may be about 1 V. As shown in FIG. 5B, when data is written from the drain side to the source side, the memory cell transistors MT connected to the word lines WL0 to WLn are in an unwritten state at the time of channel precharge. Therefore, when performing the channel precharge from the source line side, as shown in FIG. 5B, by writing the data from the drain side to the source side, a voltage applied to the word lines WL0 to WLn can be set to a low voltage, and power consumption can be reduced and an operation speed can be increased.

(2-5. Voltage Change in Each Wiring During Channel Precharge Operation and Data Write Operation)

Next, a voltage of various wirings in the selected block BLK at the time of channel precharge operation will be described. FIG. 6 is a diagram showing a voltage change in various wirings in the selected block BLK during channel precharge operation and program operation according to a comparative example. In FIG. 6, a period from time t0 to time t2 is a period in which the channel precharge operation is performed (hereinafter, referred to as a channel precharge period). After the time t2, the voltage VPGM is applied (hereinafter, referred to as a program period). Hereinafter, a combination of the channel precharge period and the program period is also referred to as a program operation period. In the present embodiment, time until the time t2 when the boosting of the selected select gate line SGD_sel is started is called the channel precharge period, and the time after the time t2 is called the program period.

In FIGS. 6-11, the selected word line WLn is shown as a selected word line WL_sel. The non-selected word lines that are located on the source side of the selected word line WL_sel (non-selected word lines WLn−1, WLn−2, and the like) are shown as source side non-selected word lines WL_usel(S). The non-selected word lines that are located on the drain side of the selected word line WL_sel (non-selected word lines WLn+1, WLn+2, and the like) are shown as drain side non-selected word lines WL_usel (D).

First, the voltage change in the channel precharge period will be described. At the time t0, the ground voltage Vss (for example, 0 V) is applied from the voltage generation circuit 28 to the select gate line SGD via the row decoder 30 to turn off the select gate transistor ST1. On the other hand, for example, 5 V is applied to the select gate line SGS to turn on the select gate transistor ST2.

For example, 1 V is applied from the voltage generation circuit 28 to the selected word line WL_sel and the source side non-selected word line WL_usel(S) via the row decoder 30, and the memory cell transistors MT connected to these word lines are turned on. On the other hand, the ground voltage Vss (for example, 0 V) is applied to the drain side non-selected word line WL_usel (D), and the memory cell transistor MT connected to these word lines is turned off.

Further, the CELSRC voltage control circuit 36 applies, for example, 2 V as a precharge voltage to the source line CELSRC. The CPWELL voltage control circuit 37 applies a ground voltage Vss (for example, 0 V) to the well line CPWELL.

That is, the voltage of the channel of the memory cell transistor MT connected to the selected word line WL_sel and the source side non-selected word line WL_usel(S) is boosted (stabilized, precharged) by the voltage supplied from the source line CELSRC.

Subsequently, at time t1 (<t2), the ground voltage Vss (for example, 0 V) is applied to the select gate line SGS to turn off the select gate transistor ST2. The ground voltage Vss (for example, 0 V) is also applied to the selected word line WL_sel and the source side non-selected word line WL_usel (S), and the memory cell transistor MT connected to the word lines is turned off.

Subsequently, the application of the voltage VPGM, which is a voltage for writing data, to the selected word line WL_sel is started. At the time t2, by applying, for example, 2.5 V to the select gate line SGD_sel of the selected string unit SU_sel, the select gate transistor ST1 is turned on or off in accordance with the voltage of the bit line BL. The select gate line SGS_sel of the selected string unit SU_sel is kept at the ground voltage Vss (for example, 0 V), and the select gate transistor ST2 is kept off.

On the other hand, the select gate line SGD_usel and the select gate line SGS_sel of the non-selected string unit SU_usel are kept at the ground voltage Vss (for example, 0 V). Therefore, the select gate transistors ST1 and ST2 of the non-selected string unit SU_usel are kept off.

Subsequently, the voltage VPGM is applied to the selected word line WL_sel, and the voltage VPASS is applied to the non-selected word line WL_usel. In the NAND string NS including the memory cell transistor MT to be written in the selected string unit SU_sel, since the select gate transistor ST1 on the bit line side is in the ON state, the voltage of the bit line BL is transferred to the channel of each NAND string NS of the selected string unit SU_sel. Therefore, when the voltage VPGM is applied to the selected word line WL_sel, the threshold voltage of the selected memory cell transistor MT increases in accordance with the voltage VPGM. (Data is written to the selected memory cell transistor MT.)

On the other hand, in the NAND string NS not including the memory cell transistor MT to be written in the selected string unit SU_sel, and the NAND string NS in the non-selected string unit SU_usel, since both the select gate transistor ST1 on the bit line side and the select gate transistor ST2 on the source side are in the off state, the channel is in a floating state. In this state, when the voltage VPGM is applied to the selected word line WL_sel, the voltage of the channel of the NAND string NS is boosted by the capacitance coupling. Therefore, since the voltage difference between the gate of the memory cell transistor MT in the non-selected string unit SU_usel and the channel of the NAND string NS becomes small, unintended write (electron injection and increase in threshold voltage) is prevented.

Here, since the select gate line SGS is connected to all the string units SU in the block BLK, the select gate line SGS has a relatively large parasitic capacitance. Therefore, a relatively long time is required in order to raise or lower the voltage. In the comparative example shown in FIG. 6, in the channel precharge period, the voltage of the select gate line SGS gradually increases from the time t0, and a predetermined time is required until the voltage increases to the applied voltage (for example, 5 V). The voltage of the select gate line SGS is gradually decreased from the time t1, and a predetermined time is required until the voltage lowers to the applied voltage (ground voltage Vss). That is, the select gate transistor ST2 is turned on after a lapse of the predetermined time from the time t0, and is turned off after a lapse of the predetermined time from the time t1. In this case, at the start of the program period at the time t2, the voltage of the select gate line SGS may not be completely lowered and the select gate transistor ST2 may be turned on. In such a case, the channel voltage leaks from the source side and the initial voltage falls (channel voltage boost leakage). Then, a channel precharge effect is reduced, and the erroneous write may occur in the memory cell transistor MT not to be written. When the boosting of the selected word line WL_sel, the non-selected word line WL_usel and the selected select gate line SGD_sel is started after the select gate transistor ST2 is turned off, since the time t2, which is a starting point of the program period, is delayed, an operation time from the start of channel precharge to the completion of the program (program operation period) becomes long.

Figure 7:
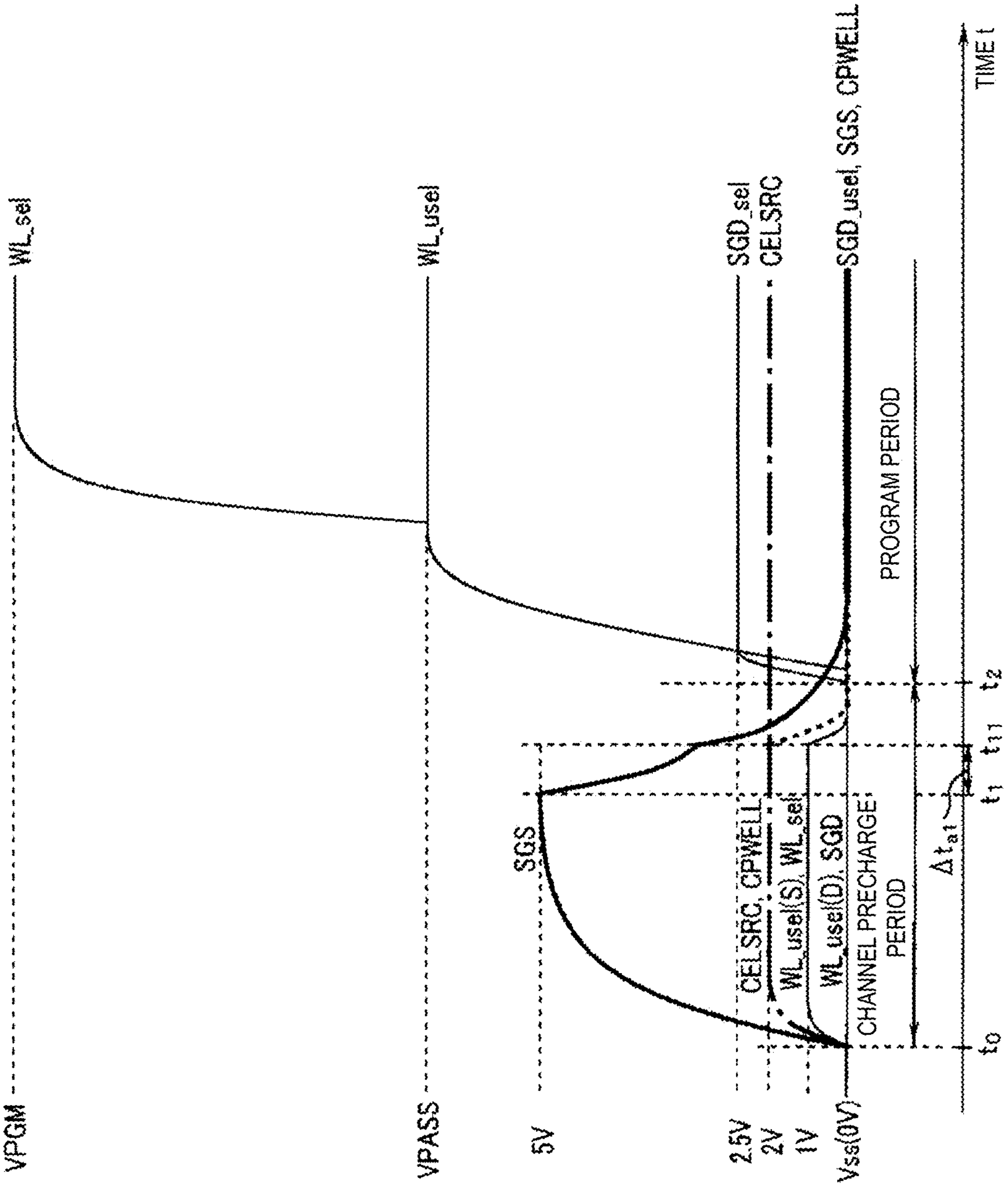
FIG. 7 is a diagram showing a voltage change in various wirings during channel precharge operation and program operation according to a first embodiment.

FIG. 7 is a diagram showing a voltage change in various wirings in the selected block BLK during the channel precharge operation and the program operation in the first embodiment. The voltage change in various wirings during the program period in the present embodiment is the same as that of the comparative example shown in FIG. 6. The present embodiment is different from the comparative example in that a voltage for assisting the boosting and the step-down of the select gate line SGS is applied to the well line CPWELL during the channel precharge period.

In the present embodiment, first, at time t0, the output end connection transistor 38 is turned on to bring the well line CPWELL to the same voltage as the source line CELSRC. That is, the same voltage (for example, 2 V) as the precharge voltage is applied to the well line CPWELL. Then, at time t1, the ground voltage Vss (for example, 0 V) is applied to the select gate line SGS. Subsequently, at time t11 which is a predetermined time Δta1 after time t1, by turning off the output end connection transistor 38, the well line CPWELL is separated from the source line CELSRC, and the ground voltage Vss (0 V, for example) is applied from the CPWELL voltage control circuit 37 to the well line CPWELL. At time t11, the voltage of the well line CPWELL is lowered from 2 V to the ground voltage Vss, whereby an assist effect by capacitance coupling between the well line CPWELL and the select gate line SGS is exerted, and the discharge (voltage reduction) of the select gate line SGS is accelerated.

That is, at the start of the program period at time t2, the voltage of the select gate line SGS can be sufficiently lowered, and the select gate transistor ST2 can be reliably turned off, so that the write can be performed while maintaining the initial voltage of the channel charged by the channel precharge, and therefore, the erroneous write in the memory cell transistor MT not to be written can be prevented. Therefore, the reliability of the memory cell can be improved. In addition, according to the present embodiment, since the select gate transistor ST2 can be turned off earlier, the channel precharge period can be shortened and the program start time (t2) can be advanced. That is, the program operation period can be shortened, and the operation performance can be improved.

In the present embodiment, as shown in FIG. 5B, data write is performed from the drain side to the source side. Accordingly, the threshold voltage of the memory cell transistor MT does not increase in a range from the word line WL0 on the source line side to the word line WLn to be written. Therefore, the voltage to be applied to the word lines WL0 to WLn in the precharge operation can be set to a low voltage, and the power consumption can be reduced or the operation speed can be increased.

In the present embodiment, the initial voltage of the channel is applied from the source line CELSRC, but not from the bit line BL. Therefore, the operation of setting the bit line BL to a voltage according to the write data can be performed in parallel with the precharge operation, and the program operation period can be further shortened.

Second Embodiment

Next, a semiconductor memory device according to a second embodiment will be described. The semiconductor memory device according to the present embodiment is different from the first embodiment in the timing of applying a voltage to a select gate line SGS and a well line CPWELL during a channel precharge period. Since a configuration of the semiconductor device and a voltage change of other wirings are the same as those in the first embodiment described above, a description thereof will be omitted. Hereinafter, a timing of applying voltage to the select gate line SGS and the well line CPWELL in the channel precharge period will be described.

Figure 8:
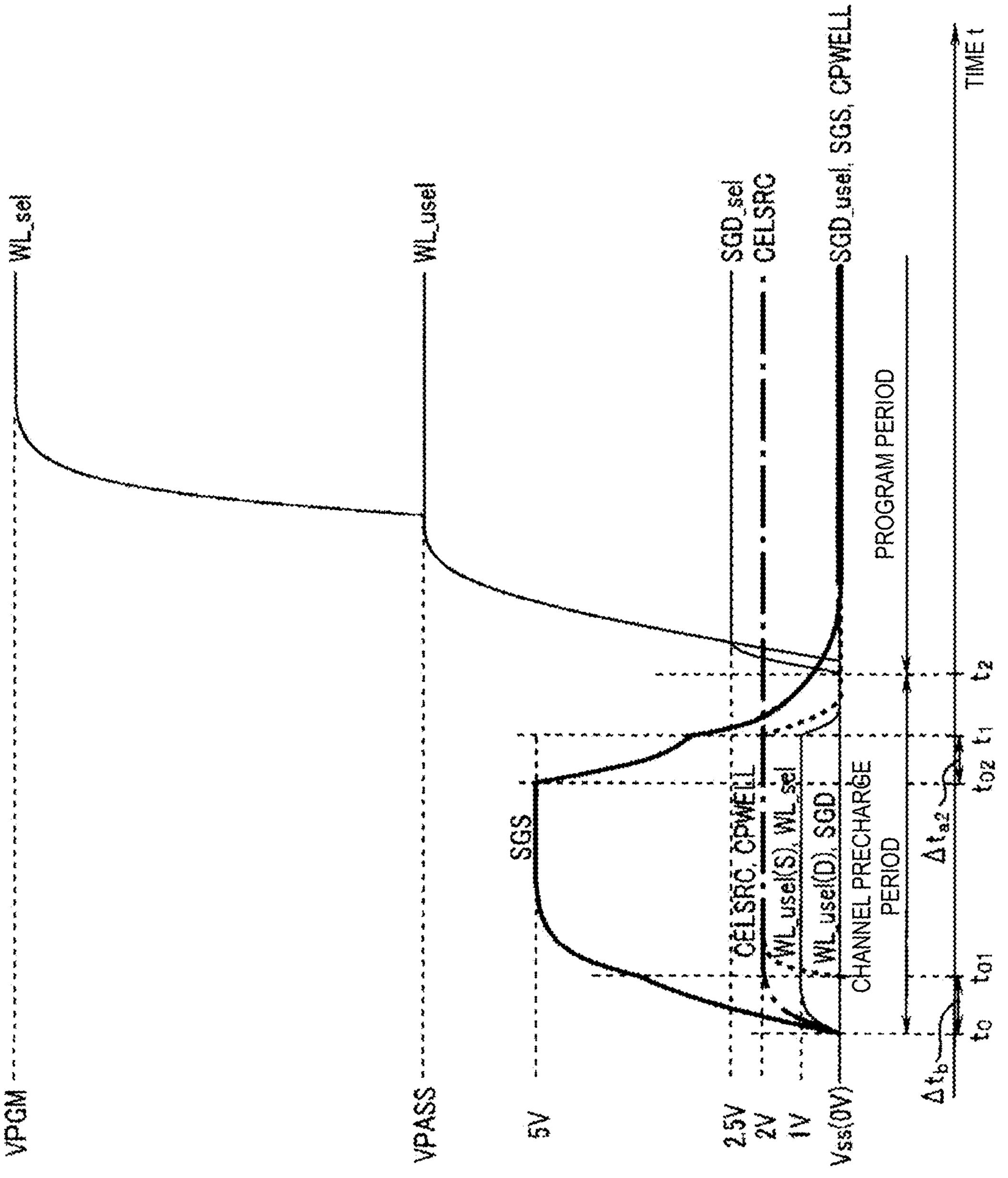
FIG. 8 is a diagram showing a voltage change in various wirings during channel precharge operation and program operation according to a second embodiment.

FIG. 8 is a diagram showing a voltage change in various wirings during channel precharge operation and program operation in the second embodiment. First, at time t0, in order to turn on the select gate transistor ST2, for example, 5 V is applied to the select gate line SGS to increase the voltage of the select gate line SGS. Next, at time t01, which is a predetermined time Δtb after time t0, the output end connection transistor 38 is turned on to bring the well line CPWELL to the same voltage as the source line CELSRC. That is, the same voltage (for example, 2 V) as the precharge voltage is applied to the well line CPWELL.

By applying the voltage to the well line CPWELL after a predetermined time later than the timing of applying the voltage to the select gate line SGS, an assist effect due to the capacitance coupling between the well line CPWELL and the select gate line SGS is exerted, and the charging (voltage increase) of the select gate line SGS is accelerated. Therefore, the select gate transistor ST2 can be turned on earlier than in the first embodiment.

Next, in order to turn off the select gate transistor ST2, at time t02, a ground voltage Vss (for example, 0 V) is applied to the select gate line SGS. Since the select gate transistor ST2 is switched to the ON state earlier than in the first embodiment, the time t02 can be set earlier than the time t1 by a predetermined time Δta2. Finally, at the time t1, by turning off the output end connection transistor 38, the well line CPWELL is separated from the source line CELSRC, and the ground voltage Vss (0 V, for example) is applied from the CPWELL voltage control circuit 37 to the well line CPWELL. At the time t1, the voltage of the well line CPWELL is lowered from 2 V to the ground voltage Vss, whereby an assist effect by capacitance coupling between the well line CPWELL and the select gate line SGS is exerted, and the discharge (voltage reduction) of the select gate line SGS is accelerated.

That is, according to the present embodiment, since the voltage of the select gate line SGS rises earlier due to the assist effect of boosting the well line CPWELL, a lowering start time (time t02) of the voltage of the select gate line SGS can be advanced. Therefore, since the period until the program start time (time t2) becomes long, the voltage of the select gate line SGS can be sufficiently lowered at the start of the program period at the time t2. Therefore, at the time t2, since the select gate transistor ST2 can be reliably turned off, and the write can be performed while maintaining the initial voltage of the channel charged by the channel precharge, the erroneous write in the memory cell transistor MT not to be written can be prevented. Therefore, the reliability of the memory cell can be improved. According to the present embodiment, since the select gate transistor ST2 can be turned off earlier, the channel precharge period can be shortened and the program start time (t2) can be further advanced. That is, by further shortening the program operation period, the operation performance can be further improved.

Third Embodiment

Next, a semiconductor memory device according to a third embodiment will be described. The semiconductor memory device of the present embodiment is different from the second embodiment in the timing of applying a voltage to the select gate line SGS and the source line CELSRC in a channel precharge period. Since a configuration of the semiconductor device and a voltage change of other wirings are the same as those in the second embodiment described above, a description thereof will be omitted. Hereinafter, a timing of applying voltage to the select gate line SGS and the source line CELSRC in the channel precharge period will be described.

Figure 9:
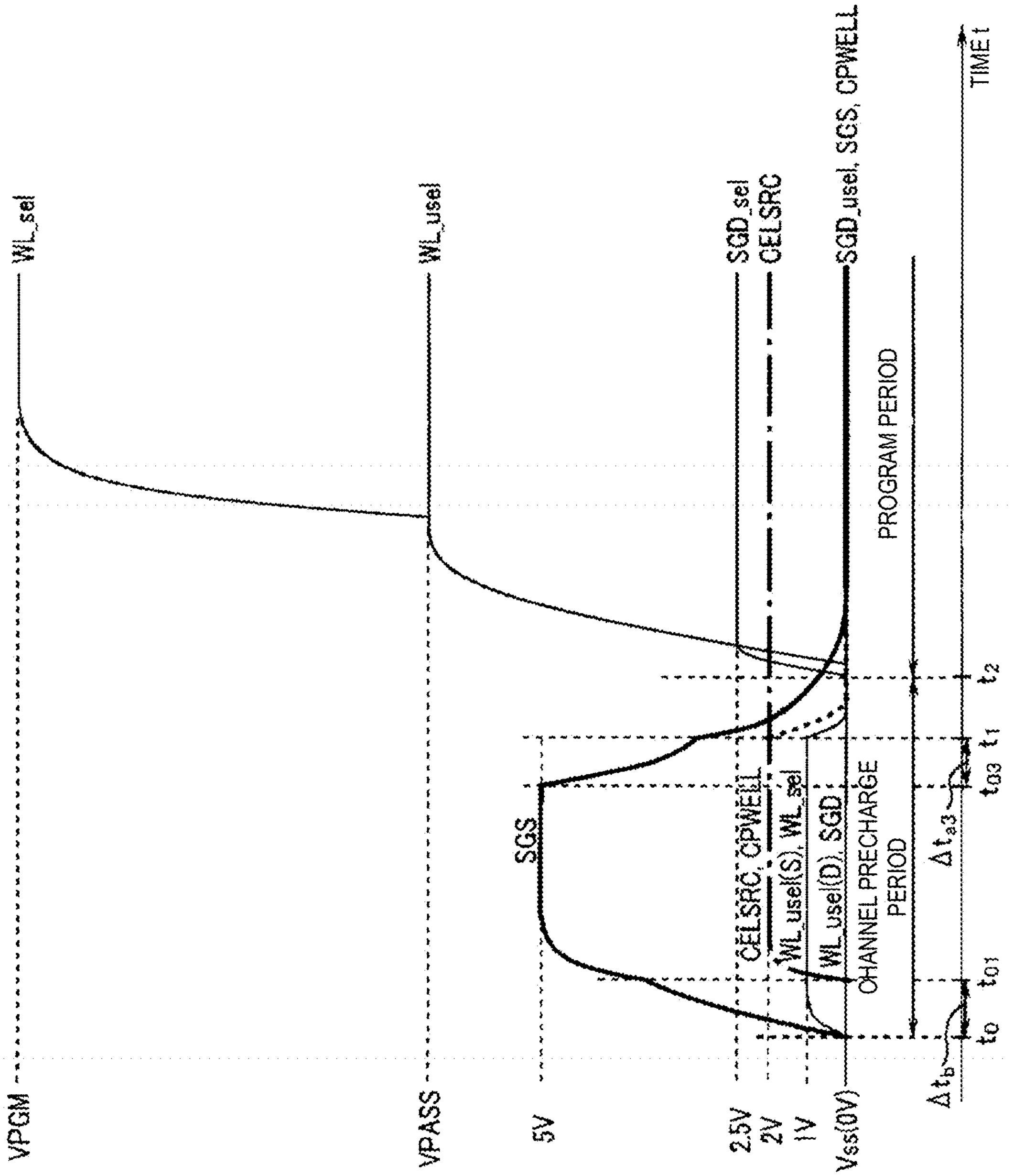
FIG. 9 is a diagram showing a voltage change in various wirings during channel precharge operation and program operation according to a third embodiment.

FIG. 9 is a diagram showing a voltage change in various wirings during channel precharge operation and program operation in the third embodiment. First, at time to, in order to turn on the select gate transistor ST2, for example, 5 V is applied to the select gate line SGS to increase the voltage of the select gate line SGS. At the time t0, the CELSRC voltage control circuit 36 applies the ground voltage Vss (for example, 0 V) to the source line CELSRC.

Next, at a time t01 which is a predetermined time (Δtb) after the time t0, the CELSRC voltage control circuit 36 applies, for example, 2 V as a precharge voltage to the source line CELSRC. Further, at the time t01, the output end connection transistor 38 is turned on to bring the well line CPWELL into the same voltage as the source line CELSRC. That is, the same voltage (for example, 2 V) as the precharge voltage is applied to the well line CPWELL.

By applying the voltage to the source line CELSRC after a predetermined time later than the timing of applying the voltage to the select gate line SGS, an assist effect due to the capacitance coupling between the source line CELSRC and the select gate line SGS is exerted, and the charging (voltage increase) of the select gate line SGS is further accelerated. Further, since the source line CELSRC and the well line CPWELL are boosted at the same timing, the coupling capacitance between the source line CELSRC and the well line CPWELL does not affect the boosting, so that the boosting speed can be increased. Therefore, the select gate transistor ST2 can be turned on earlier than in the second embodiment.

Next, in order to turn off the select gate transistor ST2, at time t03, a ground voltage Vss (for example, 0 V) is applied to the select gate line SGS. Since the select gate transistor ST2 is switched to the ON state earlier than in the second embodiment, the time t03 can be set earlier than the time t1 by a predetermined time Δta3 (Δta3>Δta2). Finally, at the time t1, by turning off the output end connection transistor 38, the well line CPWELL is separated from the source line CELSRC, and the ground voltage Vss (0 V, for example) is applied from the CPWELL voltage control circuit 37 to the well line CPWELL. At the time t1, the voltage of the well line CPWELL is lowered from 2 V to the ground voltage Vss, whereby an assist effect by capacitance coupling between the well line CPWELL and the select gate line SGS is exerted, and the discharge (voltage reduction) of the select gate line SGS is accelerated.

That is, according to the present embodiment, since the voltage of the select gate line SGS rises earlier due to the assist effect of boosting the source line CELSRC in addition to the well line CPWELL, a lowering start time (time t03) of the voltage of the select gate line SGS can be advanced. Therefore, since the period until the program start time (time t2) becomes long, the voltage of the select gate line SGS can be sufficiently lowered at the start of the program period at the time t2. Therefore, at the time t2, since the select gate transistor ST2 can be reliably turned off, and the write can be performed while maintaining the initial voltage of the channel charged by the channel precharge, the erroneous write in the memory cell transistor MT not to be written can be prevented. Therefore, the reliability of the memory cell can be improved. According to the present embodiment, since the select gate transistor ST2 can be turned off earlier, the channel precharge period can be shortened and the program start time (t2) can be further advanced. That is, by further shortening the program operation period, the operation performance can be further improved.

Fourth Embodiment

Figure 10:
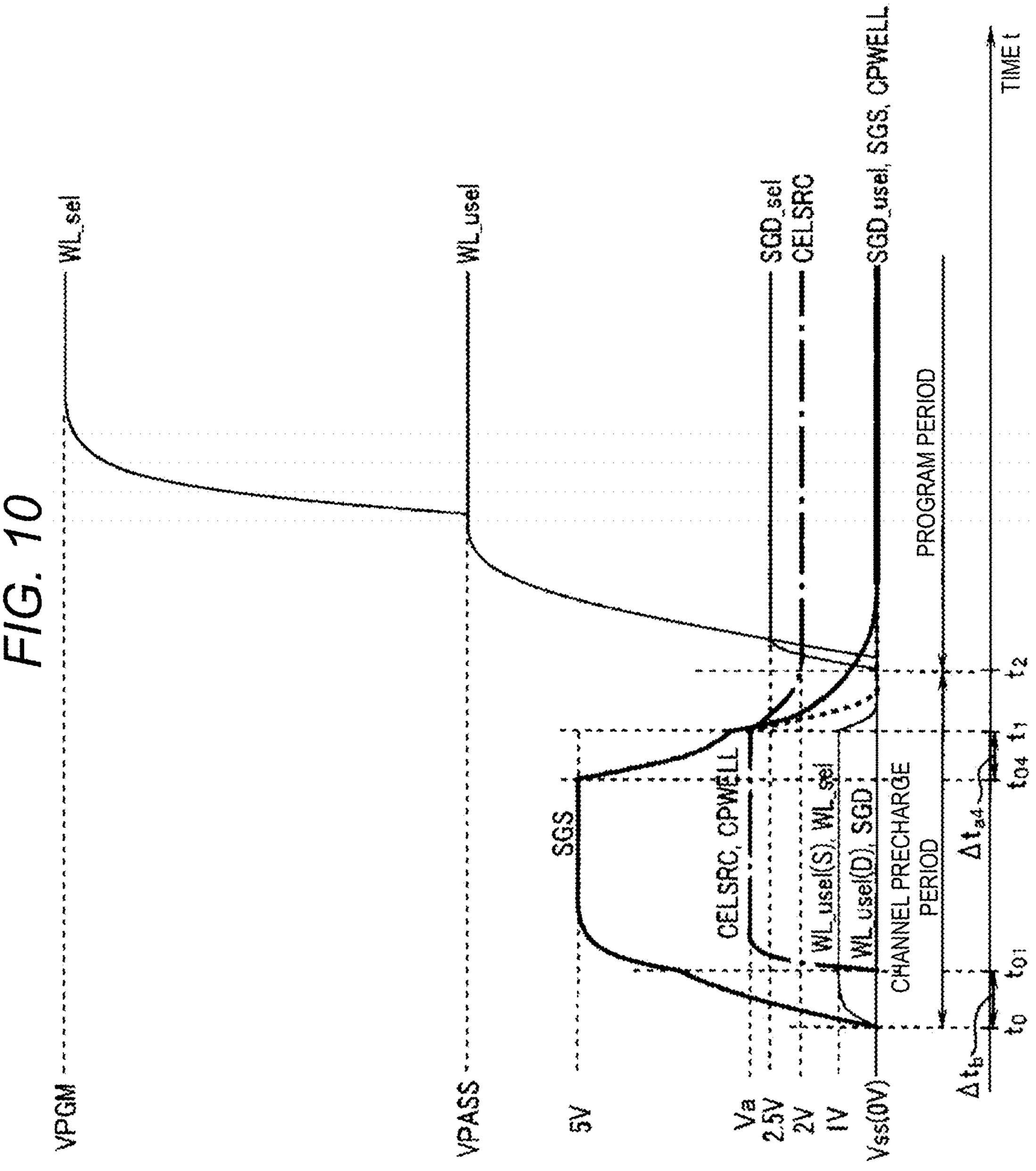
FIG. 10 is a diagram showing a voltage change in various wirings during channel precharge operation and program operation according to a fourth embodiment.

Next, a semiconductor memory device according to a fourth embodiment will be described. The semiconductor memory device according to the present embodiment is different from the above-described third embodiment in the voltage applied to the source line CELSRC and the well line CPWELL during the channel precharge period. FIG. 10 is a diagram showing a voltage change in various wirings during channel precharge operation and program operation in the fourth embodiment. As shown in FIG. 10, at time t01, the CELSRC voltage control circuit 36 applies a voltage Va (Va>2V) to the source line CELSRC as a precharge voltage. Further, at the time t01, the output end connection transistor 38 is turned on to bring the well line CPWELL into the same voltage as the source line CELSRC. That is, the same voltage Va as the precharge voltage is applied to the well line CPWELL.

By increasing the precharge voltage applied to the source line CELSRC later than the timing of applying the voltage to the select gate line SGS by a predetermined time, the assist effect by the capacitance coupling is further enhanced, and the charge (voltage increase) of the select gate line SGS is further enhanced. Therefore, the select gate transistor ST2 can be turned on earlier than in the third embodiment.

Next, in order to turn off the select gate transistor ST2, at time t04, a ground voltage Vss (for example, 0 V) is applied to the select gate line SGS. Since the select gate transistor ST2 is switched to the ON state earlier than in the third embodiment, the time t04 can be set earlier than the time t1 by a predetermined time Δta4 (Δta4>Δta3). Finally, at the time t1, the CELSRC voltage control circuit 36 switches the voltage applied to the source line CELSRC to 2 V. By turning off the output end connection transistor 38, the well line CPWELL is separated from the source line CELSRC, and the ground voltage Vss (0 V, for example) is applied from the CPWELL voltage control circuit 37 to the well line CPWELL.

At the time t1, the voltage of the well line CPWELL is lowered from Va to the ground voltage Vss, whereby the assist effect by the capacitance coupling between the well line CPWELL and the select gate line SGS is further enhanced, and the discharge (voltage reduction) of the select gate line SGS is accelerated.

That is, according to the present embodiment, at the time t2, since the select gate transistor ST2 can be reliably turned off, and the write can be performed while maintaining the initial voltage of the channel charged by the channel precharge, the erroneous write in the memory cell transistor MT not to be written can be prevented. Therefore, the reliability of the memory cell can be improved. Since the select gate transistor ST2 can be turned off earlier, the channel precharge period can be shortened and the program start time (t2) can be further advanced. That is, by further shortening the program operation period, the operation performance can be further improved.

Fifth Embodiment

Figure 11:
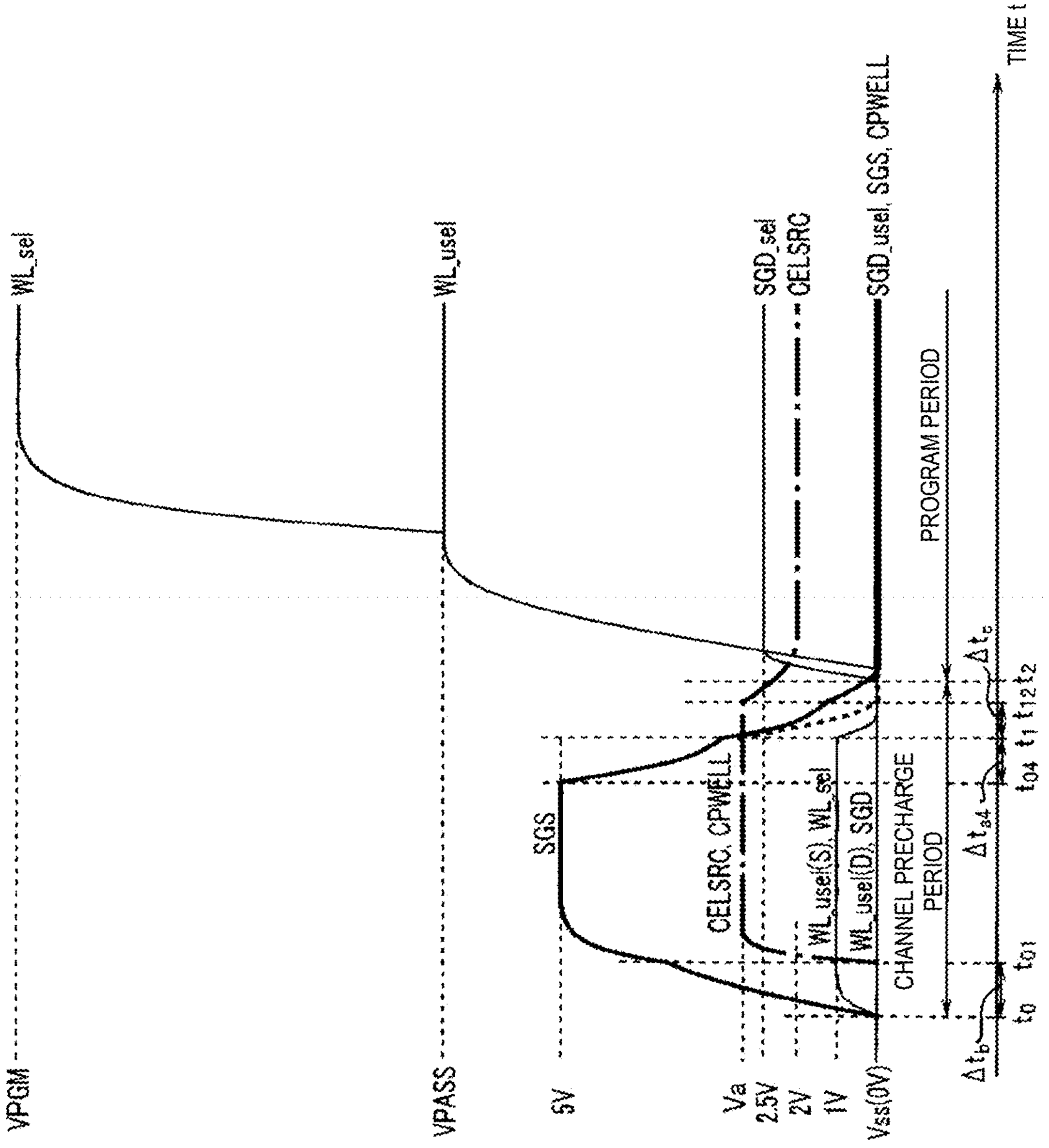
FIG. 11 is a diagram showing a voltage change in various wirings during channel precharge operation and program operation according to a fifth embodiment.

Next, a semiconductor memory device according to a fifth embodiment will be described. The semiconductor memory device according to the present embodiment is different from the fourth embodiment in the timing of switching (lowering) the voltage of the source line CELSRC in the channel precharge period. FIG. 11 is a diagram showing a voltage change in various wirings during channel precharge operation and program operation in the fifth embodiment. As shown in FIG. 11, at time t21 which is a predetermined time Δtc after time t1, the CELSRC voltage control circuit 36 switches the voltage applied to the source line CELSRC to 2 V. As described above, the timing of lowering the voltage of the source line CELSRC is set later than the timing of lowering the voltage of the well line CPWELL, so that the assist effect due to the capacitance coupling between the source line CELSRC and the select gate line SGS is added to the assist effect due to the capacitance coupling between the well line CPWELL and the select gate line SGS, and therefore, the discharge (voltage reduction) of the select gate line SGS is further accelerated.

That is, according to the present embodiment, at the time t2, since the select gate transistor ST2 can be reliably turned off, and the write can be performed while maintaining the initial voltage of the channel charged by the channel precharge, the erroneous write in the memory cell transistor MT not to be written can be prevented. Therefore, the reliability of the memory cell can be improved. Since the select gate transistor ST2 can be turned off earlier, the channel precharge period can be shortened and the program start time (t2) can be further advanced. That is, by further shortening the program operation period, the operation performance can be further improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:

a conductive region having a surface extending in a first direction and a second direction and facing a third direction, the first to third directions crossing one another;

a first select gate line extending in the first direction and the second direction and being provided above the conductive region in the third direction;

a first word line extending in the first direction and the second direction and being provided above the first select gate line in the third direction;

a second word line extending in the first direction and the second direction and being provided above the first word line in the third direction;

a third word line extending in the first direction and the second direction and being provided above the second word line in the third direction;

a second select gate line extending in the first direction and the second direction and being provided above the third word line in the third direction;

a bit line extending in the first direction and being provided above the second select gate line in the third direction; and a first memory string extending in the third direction and connected between the bit line and the conductive region, the first memory string including a first select transistor to a gate of which the first select gate line is connected, a first memory cell transistor to a gate of which the first word line is connected, a second memory cell transistor to a gate of which the second word line is connected, a third memory cell transistor to a gate of which the third word line is connected, and a second select transistor to a gate of which the second select gate line is connected;

a row decoder configured to apply voltages to the first select gate line, the first word line, the second word line, the third word line, and the second select gate line, respectively; and a sequencer configured to perform a first write operation to write data into the third memory cell transistor, a second write operation to write data into the second memory cell transistor, after the first write operation is performed, and a third write operation to write data into the first memory cell transistor, after the second write operation is performed, wherein, in the second write operation, before writing the data into the second memory cell transistor, the row decoder is controlled to:

at a first timing, apply a first voltage to the first select gate line to thereby turn on the first select transistor, and apply a second voltage to the first word line to thereby turn on the first memory cell transistor;

at a second timing after the first timing, apply a third voltage lower than the first voltage to the first select gate line to turn off the first select transistor;

at a third timing after the second timing, apply a fourth voltage higher than the second voltage to the first word line, apply a fifth voltage higher than the second voltage to the second word line, and apply a sixth voltage higher than the second voltage to the third word line; and at a fourth timing after the third timing, apply a seventh voltage higher than the fourth to sixth voltages to the second word line.

2. The semiconductor memory device according to claim 1, wherein the row decoder is further controlled to:

at the first timing, apply an eighth voltage to the second word line.

3. The semiconductor memory device according to claim 2, wherein the eighth voltage is equal to the second voltage.

4. The semiconductor memory device according to claim 3, wherein at the first timing, a channel of the second memory cell transistor is electrically connected to the conductive region through a channel of the first memory cell transistor and a channel of the first select transistor.

5. The semiconductor memory device according to claim 1, wherein the row decoder is further controlled to:

at the first timing, apply a ninth voltage lower than the second voltage to the third word line.

6. The semiconductor memory device according to claim 5, wherein the ninth voltage is a ground voltage.

7. The semiconductor memory device according to claim 1, further comprising:

a first line connected to the conductive region; and a first voltage apply circuit configured to apply a voltage to the first line, wherein the first voltage apply circuit is controlled to:

at a fifth timing that is simultaneous with or after the first timing and before the second timing, apply a tenth voltage to the first line; and at a sixth timing after the second timing and before the third timing, apply an eleventh voltage lower than the tenth voltage to the first line.

8. The semiconductor memory device according to claim 7, wherein the fifth timing is simultaneous with the first timing.

9. The semiconductor memory device according to claim 7, wherein the fifth timing is after the first timing.

10. The semiconductor memory device according to claim 7, further comprising:

a second line connected to the conductive region; and a second voltage apply circuit configured to apply a voltage to the second line, wherein the second voltage apply circuit is controlled to:

at a seventh timing that is simultaneous with or after the first timing and before the second timing, apply a twelfth voltage to the second line.

11. The semiconductor memory device according to claim 10, wherein the fifth timing is simultaneous with the first timing, and the seventh timing is simultaneous with the first timing.

12. The semiconductor memory device according to claim 10, wherein the fifth timing is after the first timing, and the seventh timing is simultaneous with the first timing.

13. The semiconductor memory device according to claim 10, wherein the fifth timing is after the first timing, and the seventh timing is simultaneous with the fifth timing.

14. The semiconductor memory device according to claim 10, wherein the first voltage is higher than a thirteenth voltage that is applied by the second voltage apply circuit to the second line when writing data to the second memory cell transistor.

15. The semiconductor memory device according to claim 10, wherein the second voltage apply circuit is further controlled to:

at an eighth timing that is after the second timing, apply a thirteenth voltage lower than the twelfth voltage to the second line.

16. The semiconductor memory device according to claim 15, wherein the eighth timing is simultaneous with the sixth timing.

17. The semiconductor memory device according to claim 15, wherein the eighth timing is after the sixth timing.

* * * * *